United States Patent
Hsu et al.

(10) Patent No.: US 9,871,070 B2
(45) Date of Patent: Jan. 16, 2018

(54) VOLTAGE BIASED METAL SHIELDING AND DEEP TRENCH ISOLATION FOR BACKSIDE ILLUMINATED (BSI) IMAGE SENSORS

(71) Applicant: Taiwan Semiconductor Manufacturing Co., Ltd., Hsin-Chu (TW)

(72) Inventors: Tzu-Hsuan Hsu, Kaohsiung (TW); Ching-Chun Wang, Tainan (TW); Chien-Hsien Tseng, Hsinchu (TW); Chen-Jong Wang, Hsin-Chu (TW); Feng-Chi Hung, Chu-Bei (TW); Wen-I Hsu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/016,502

(22) Filed: Feb. 5, 2016

(65) Prior Publication Data

US 2017/0229494 A1 Aug. 10, 2017

(51) Int. Cl.
*H01L 27/146* (2006.01)

(52) U.S. Cl.
CPC ...... *H01L 27/1463* (2013.01); *H01L 27/1464* (2013.01); *H01L 27/14621* (2013.01); *H01L 27/14623* (2013.01); *H01L 27/14636* (2013.01); *H01L 27/14643* (2013.01); *H01L 27/14645* (2013.01); *H01L 27/14647* (2013.01); *H01L 27/14678* (2013.01); *H01L 27/14685* (2013.01); *H01L 27/14687* (2013.01)

(58) Field of Classification Search
None
See application file for complete search history.

(56) References Cited

U.S. PATENT DOCUMENTS

| | | | | |
|---|---|---|---|---|
| 2014/0061839 A1* | 3/2014 | Ting | ................. | H01L 27/14623 257/435 |
| 2014/0263962 A1* | 9/2014 | Ahn | ................. | H01L 27/14618 250/208.1 |

\* cited by examiner

*Primary Examiner* — Minh-Loan Tran
(74) *Attorney, Agent, or Firm* — Eschweiler & Potashnik, LLC

(57) ABSTRACT

A backside illuminated (BSI) image sensor for biased backside deep trench isolation (BDTI) and/or biased backside shielding is provided. A photodetector is arranged in a semiconductor substrate, laterally adjacent to a peripheral opening in the semiconductor substrate. An interconnect structure is arranged under the semiconductor substrate. A pad structure is arranged in the peripheral opening, and protrudes through a lower surface of the peripheral opening to the interconnect structure. A conductive layer is electrically coupled to the pad structure, and extends laterally towards the photodetector from over the pad structure. A method for manufacturing the BSI image sensor is also provided.

20 Claims, 26 Drawing Sheets

VOLTAGE BIASED METAL SHIELDING AND DEEP TRENCH ISOLATION FOR BACKSIDE ILLUMINATED (BSI) IMAGE SENSORS

BACKGROUND

Many modern day electronic devices include complementary metal-oxide-semiconductor (CMOS) image sensors that convert optical images to digital data representing the optical images. One type of CMOS image sensor commonly used in electronic devices is a backside illuminated (BSI) image sensor. A BSI image sensor comprises an array of photodetectors overlying an interconnect structure and configured to receive radiation on an opposite side as the interconnect structure. This arrangement allows radiation to impinge on the photodetectors unobstructed by conductive features in the interconnect structure, such that the BSI image sensor has high sensitivity to incident radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
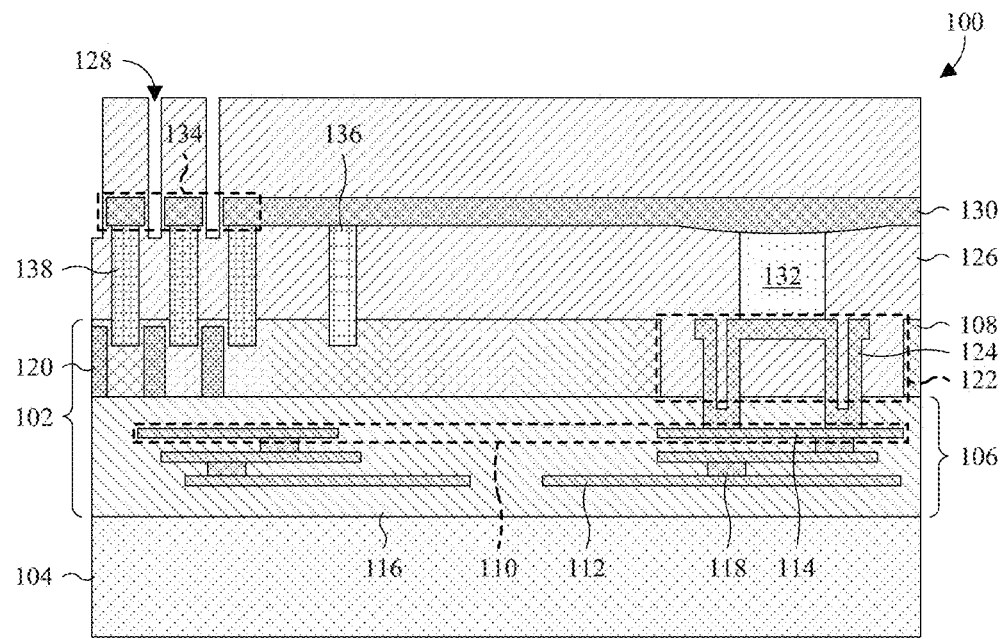
FIG. 1 illustrates a cross-sectional view of some embodiments of a backside illuminated (BSI) image sensor for biased backside deep trench isolation (BDTI) and/or biased backside shielding.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some backside illuminated (BSI) image sensors comprise an array of photodetectors arranged within a semiconductor substrate that overlies an interconnect structure. The photodetectors extend into the semiconductor substrate from proximate the interconnect structure, and are configured to receive radiation from an upper side of the semiconductor substrate. A backside deep trench isolation (BDTI) structure and/or a backside shield structure are arranged on the upper side of the semiconductor structure, and are arranged laterally between the pixel sensors to define respective grid patterns providing optical isolation between neighboring photodetectors. The BDTI structure extends into the semiconductor substrate, whereas the backside shield structure is confined over the semiconductor substrate.

Notwithstanding the optical benefits of the BDTI structure and the backside shield structure, the BDTI structure and/or the backside shield structure may facilitate leakage of charge between neighboring photodetectors. The BDTI structure is conductive and left floating (i.e., unbiased), such that charge can flow between photodetectors by way of the BDTI structure. Further, the backside shield structure is conductive and indirectly grounded through the semiconductor substrate and the interconnect structure. As such, a grounding path for the backside shield structure may have a high resistance and charge may flow between the photodetectors by way of the backside shield structure.

The present application is directed towards a BSI image sensor for biased BDTI and/or biased backside shielding. In some embodiments, a photodetector is arranged in a semiconductor substrate, laterally adjacent to a peripheral opening in the semiconductor substrate, and a pad structure is arranged within the peripheral opening. An interconnect structure is arranged under the semiconductor substrate, and the pad structure protrudes through a lower surface of the peripheral opening to the interconnect structure. A conductive layer is electrically coupled to the pad structure, and extends laterally towards the photodetector from over the pad structure. In some embodiments, the conductive layer extends laterally to a BDTI structure laterally surrounding the photodetector, and electrically couples with the BDTI structure. Further, in some embodiments, the conductive layer comprises a backside shield structure laterally surrounding the photodetector, such that the backside shield structure is electrically coupled to the pad structure.

By electrically coupling the backside shield structure and/or the BDTI structure to the pad structure, the backside shield structure and/or the BDTI structure may be biased. For example, the backside shield structure and/or the BDTI structure may be electrically coupled to ground through the pad structure. Further, by biasing the backside shield structure and/or the BDTI structure through the conductive layer, the backside shield structure and/or the BDTI structure may be biased through a low resistance path. The foregoing, in turn, allow leakage current to advantageously be minimized between photodetectors, while also providing optical isolation between the photodetectors.

With reference to FIG. 1, a cross-sectional view 100 of some embodiments of a BSI image sensor for biased BDTI and/or biased backside shielding is provided. As illustrated, a sensor chip 102 is arranged over and bonded to a support structure 104 through an interconnect structure 106 of the sensor chip 102. In some embodiments, the sensor chip 102 is bonded to the support structure 104 by a fusion bond or a hybrid bond. The support structure 104 may be, for example, an integrated circuit (IC) chip or a carrier substrate.

The interconnect structure 106 underlies a semiconductor substrate 108 of the sensor chip 102, and comprises interconnect layers 110 of conductive features 112, 114 stacked within an interlayer dielectric (ILD) region 116 and interconnected by interconnect vias 118. For ease of illustration, only one of the interconnect layers 110, some of the conductive features 112, 114, and one of the interconnect vias 118 are labeled. Further, the interconnect layers 110 may, for example, be electrically coupled to the support structure 104 by the hybrid bond or by a through-interconnect via (TIV) (not shown) extending through the semiconductor substrate 108 and the interconnect structure 106 to the support structure 104.

An array of photodetectors 120 and a peripheral opening 122 are arranged in the semiconductor substrate 108, laterally spaced from one another. For ease of illustration, only one of the photodetectors 120 is labeled. The peripheral opening 122 is arranged at a periphery of the semiconductor substrate 108, and filled by a pad structure 124 and a dielectric region 126. The pad structure 124 protrudes through the dielectric region 126 and a lower surface of the peripheral opening 122 to electrically couple with the interconnect structure 106. The dielectric region 126 electrically insulates the pad structure 124 from the semiconductor substrate 108, and covers the semiconductor substrate 108. Further, the dielectric region 126 comprises an array of color filter openings 128 arranged over respective ones of the photodetectors 120 and configured to accommodate respective color filters (not shown). For ease of illustration, only one of the color filter openings 128 is labeled.

A conductive layer 130 is arranged over the pad structure 124, in the dielectric region 126, and is electrically coupled to the pad structure 124 by a plug structure 132 extending from the conductive layer 130 to the pad structure 124. Further, the conductive layer 130 extends laterally towards the array of photodetectors 120 from over the pad structure 124. In some embodiments, the conductive layer 130 comprises a backside shield structure 134 arranged over the photodetectors 120 and laterally between the photodetectors 120 and/or the color filter openings 128 according to a grid pattern. The grid pattern advantageously provides optical isolation between the photodetectors 120 and/or the color filter openings 128.

In some embodiments, a ground structure 136 and/or a BDTI structure 138 are arranged under and electrically coupled to the conductive layer 130, and extend into the semiconductor substrate 108 from proximate the conductive layer 130. The ground structure 136 is further arranged laterally between the array of photodetectors 120 and the pad structure 124. The BDTI structure 138 is further arranged laterally between the photodetectors 120 according to a grid pattern to advantageously provide optical isolation between the photodetectors 120. In some embodiments, the BDTI structure 138 is spaced from the conductive layer 130 and electrically coupled to the conductive layer 130 through the ground structure 136.

By electrically coupling the backside shield structure 134 and/or the BDTI structure 138 to the pad structure 124, the backside shield structure 134 and/or the BDTI structure 138 may be advantageously be grounded or otherwise biased. Further, by biasing the backside shield structure 134 and/or the BDTI structure 138 through the conductive layer 130, the backside shield structure 134 and/or the BDTI structure 138 may advantageously be grounded or otherwise biased through a low resistance path. The foregoing advantageous, in turn, allow leakage current to be minimized between the photodetectors 120, while also providing optical isolation between the photodetectors 120.

Figure 2A:
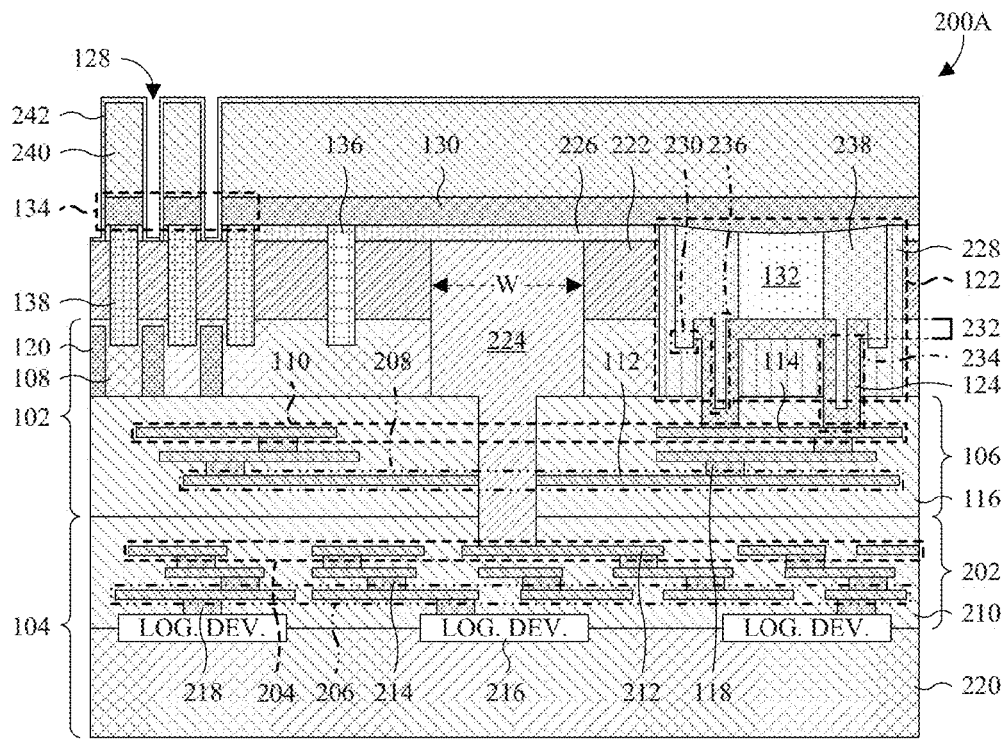
FIGS. 2A-2X illustrate cross-sectional views of some more detailed embodiments of the BSI image sensor of FIG. 1.
Figure 2B:
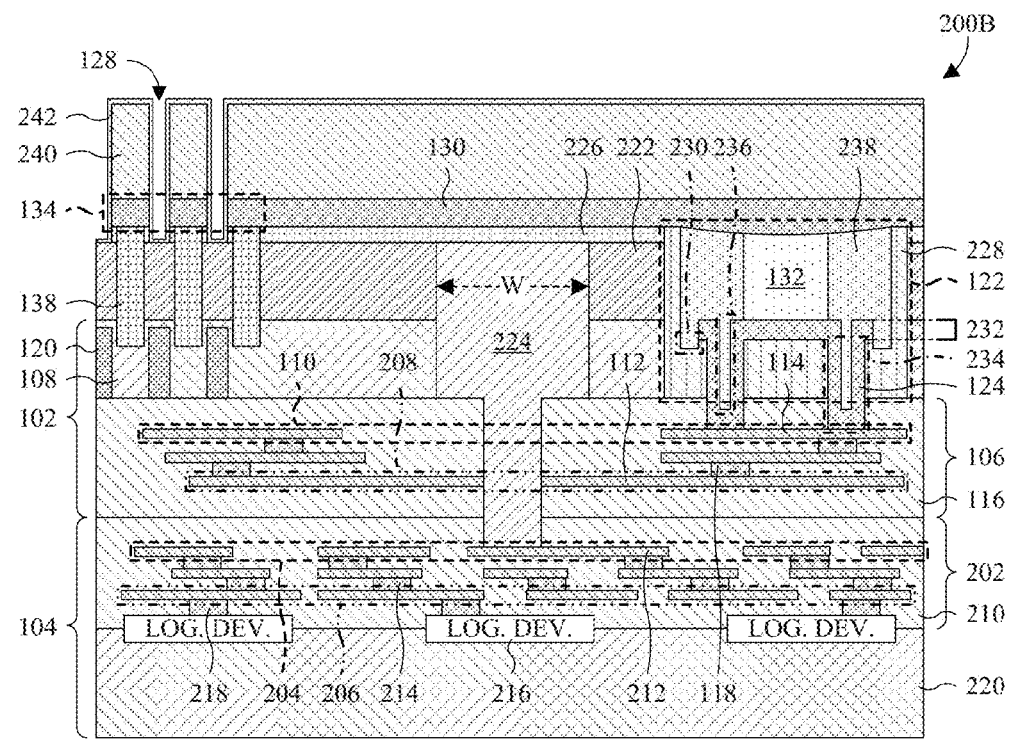
Figure 2C:
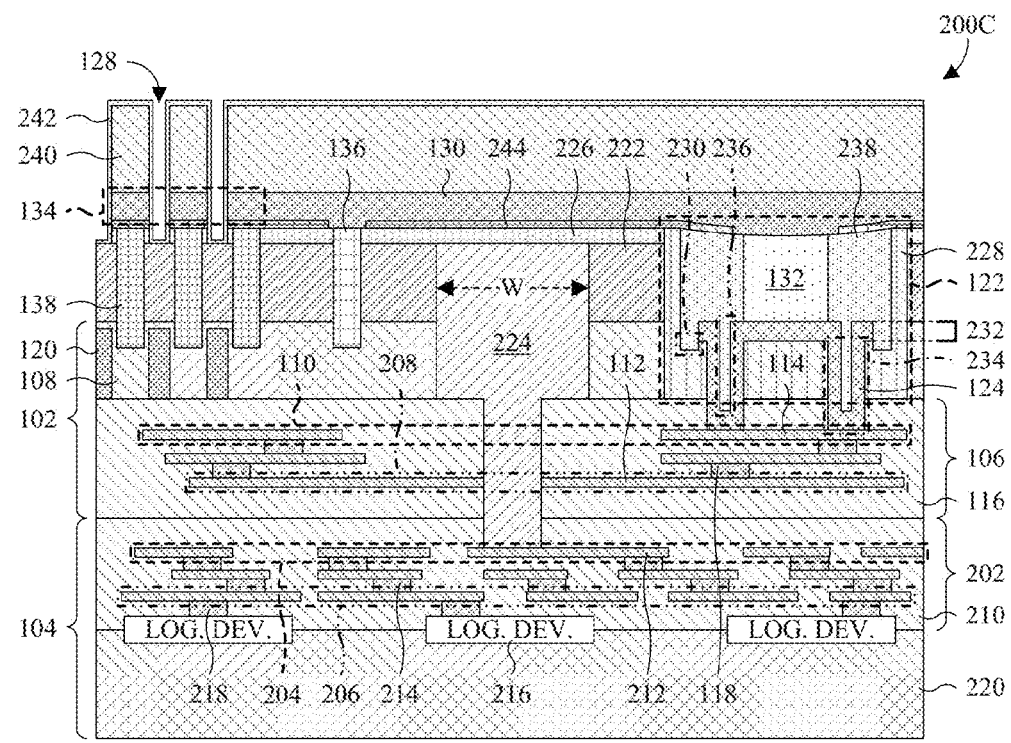
Figure 2D:
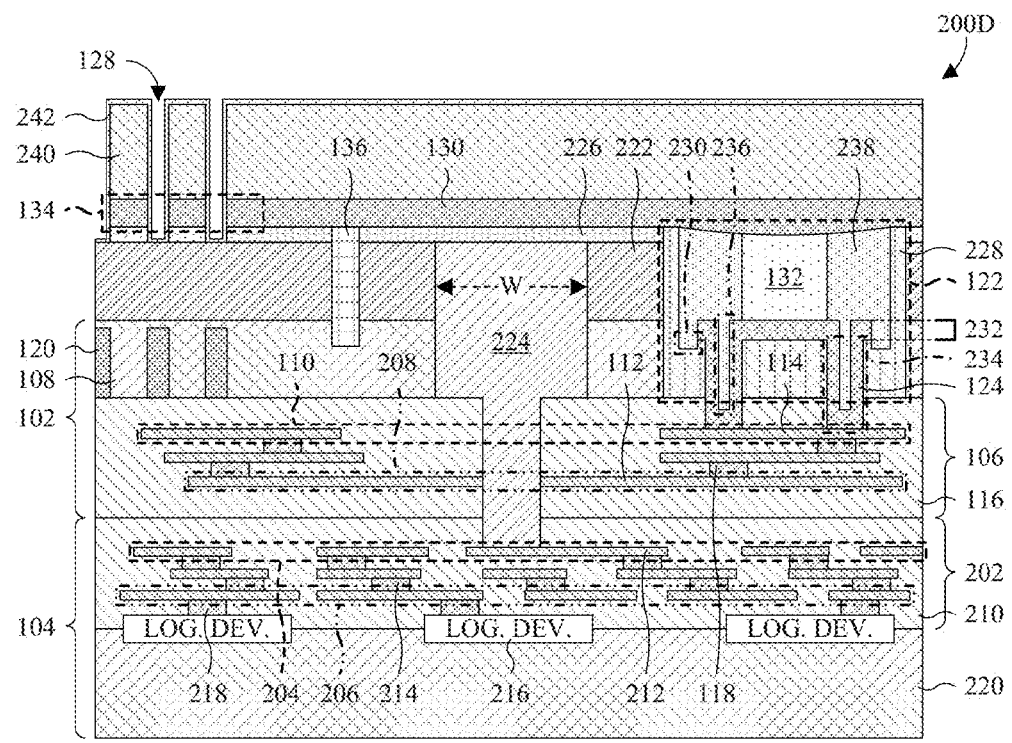
Figure 2E:
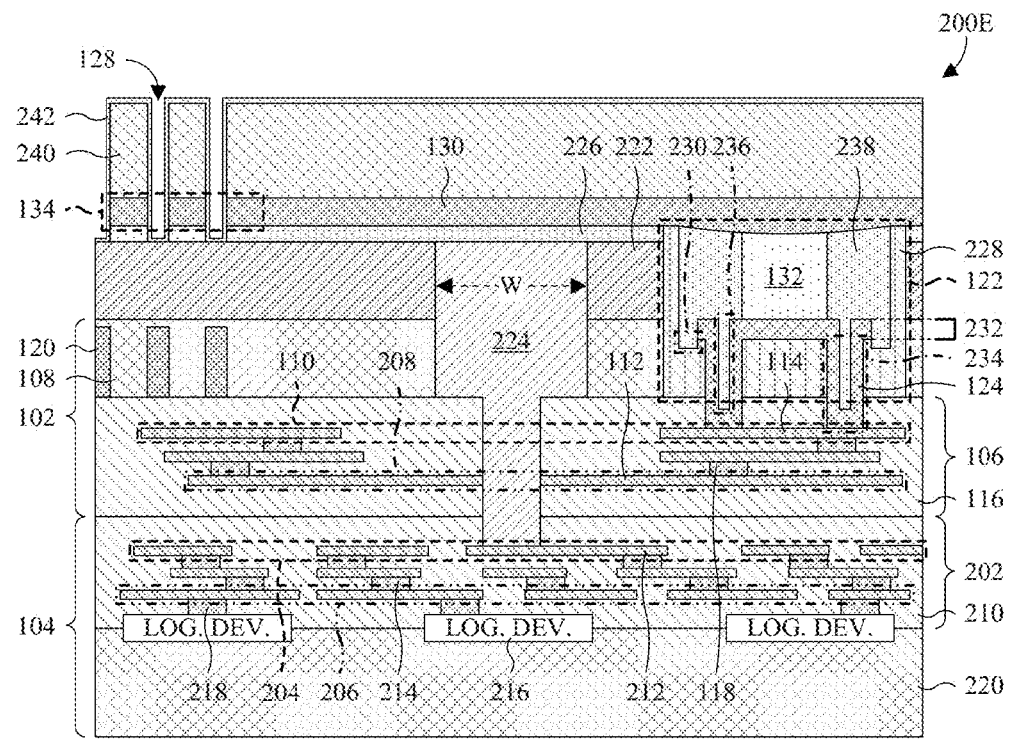
Figure 2F:
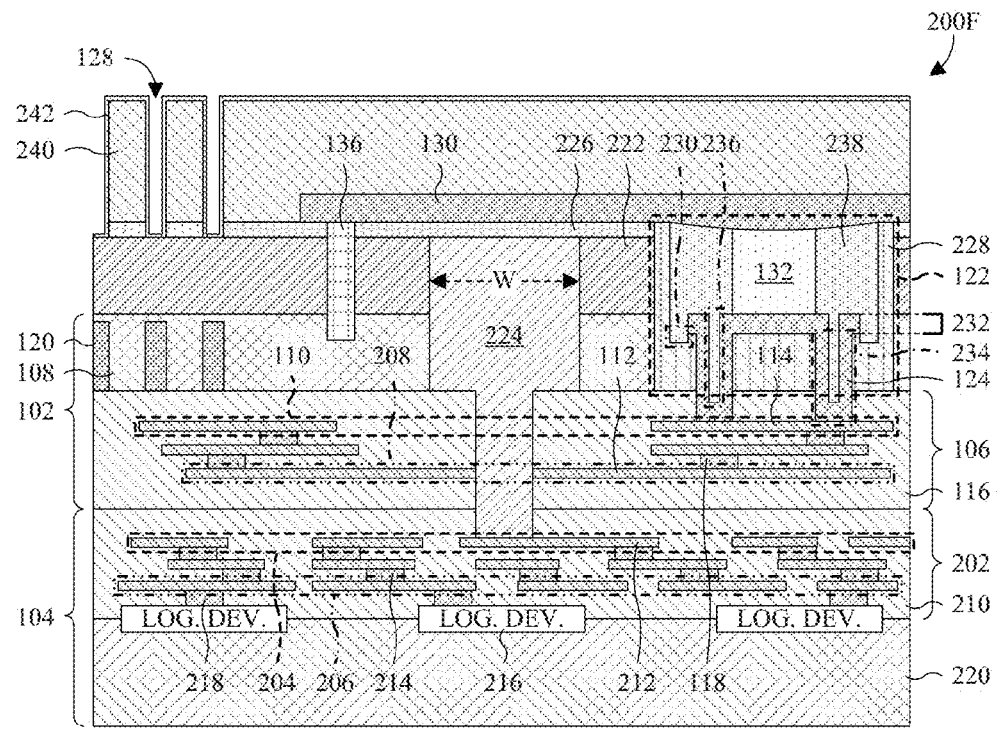
Figure 2G:
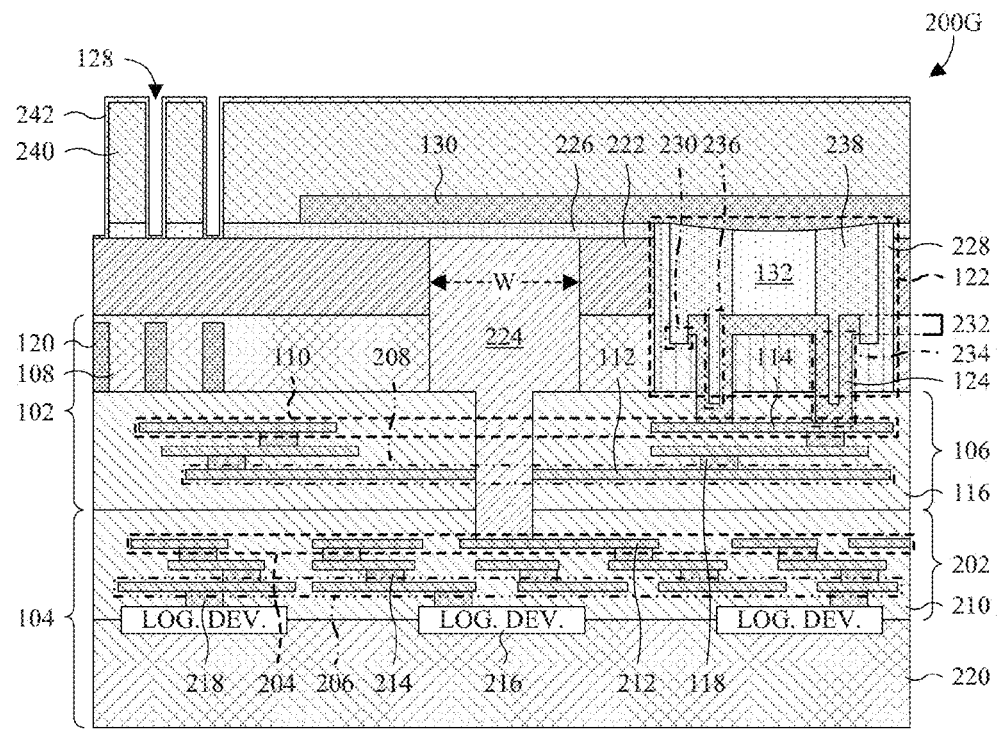
Figure 2H:
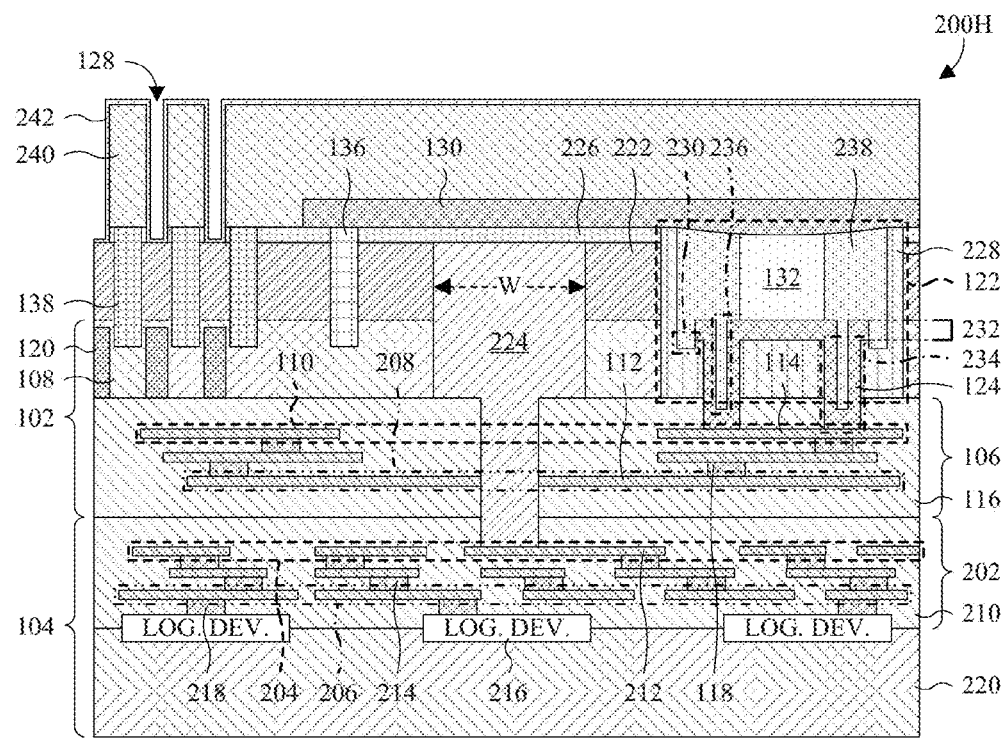
Figure 2I:
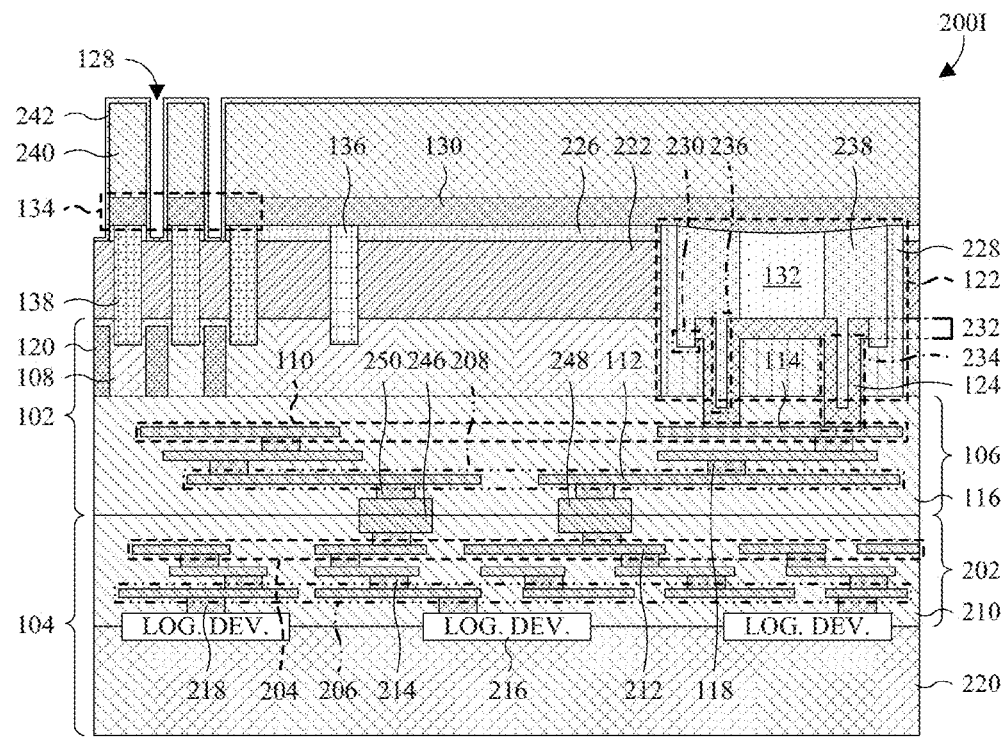
Figure 2J:
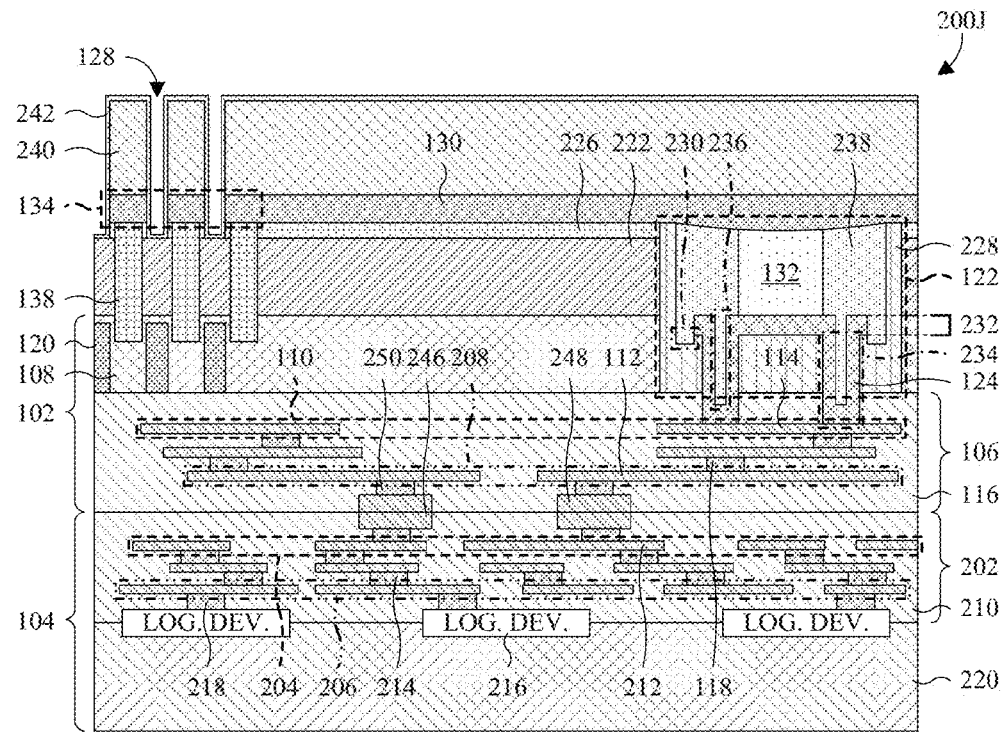
Figure 2K:
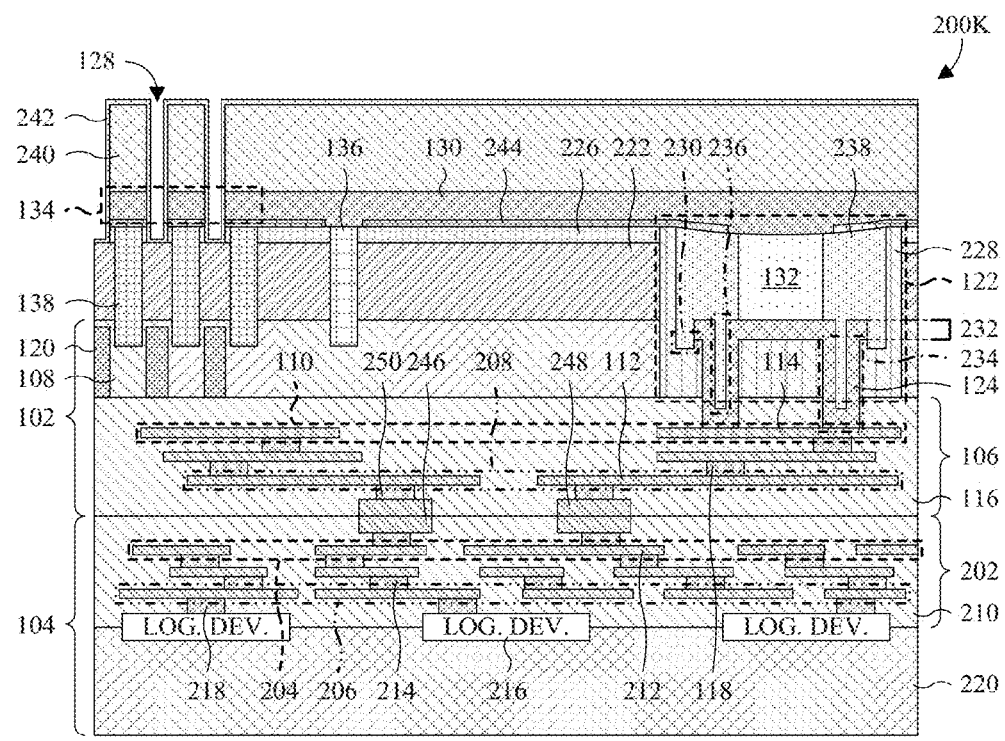
Figure 2L:
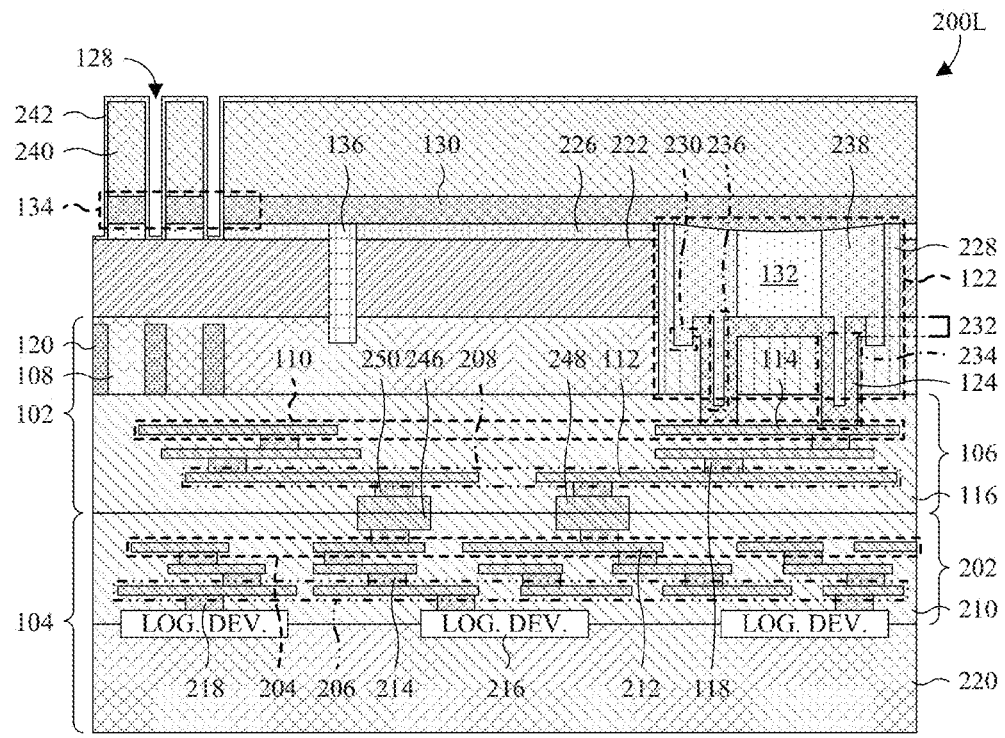
Figure 2M:
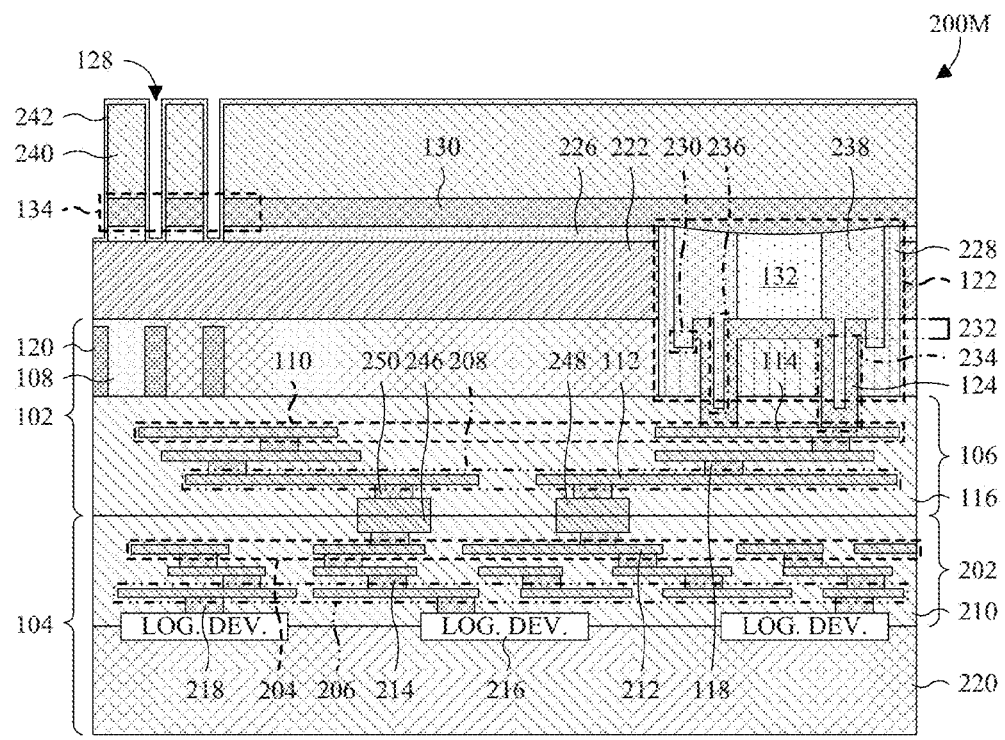
Figure 2N:
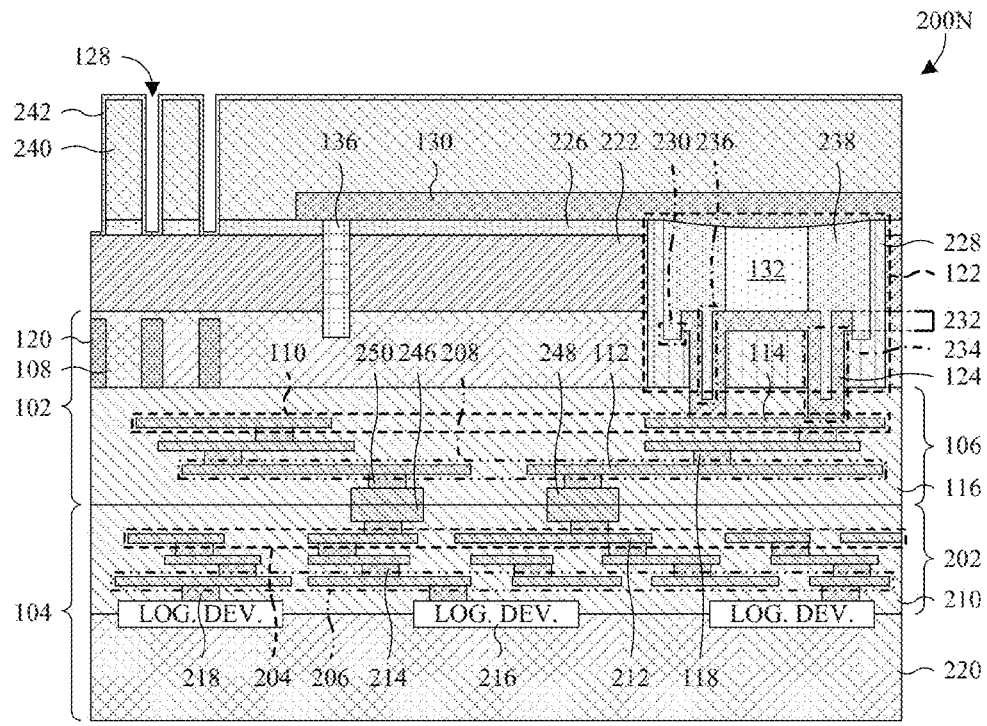
Figure 2O:
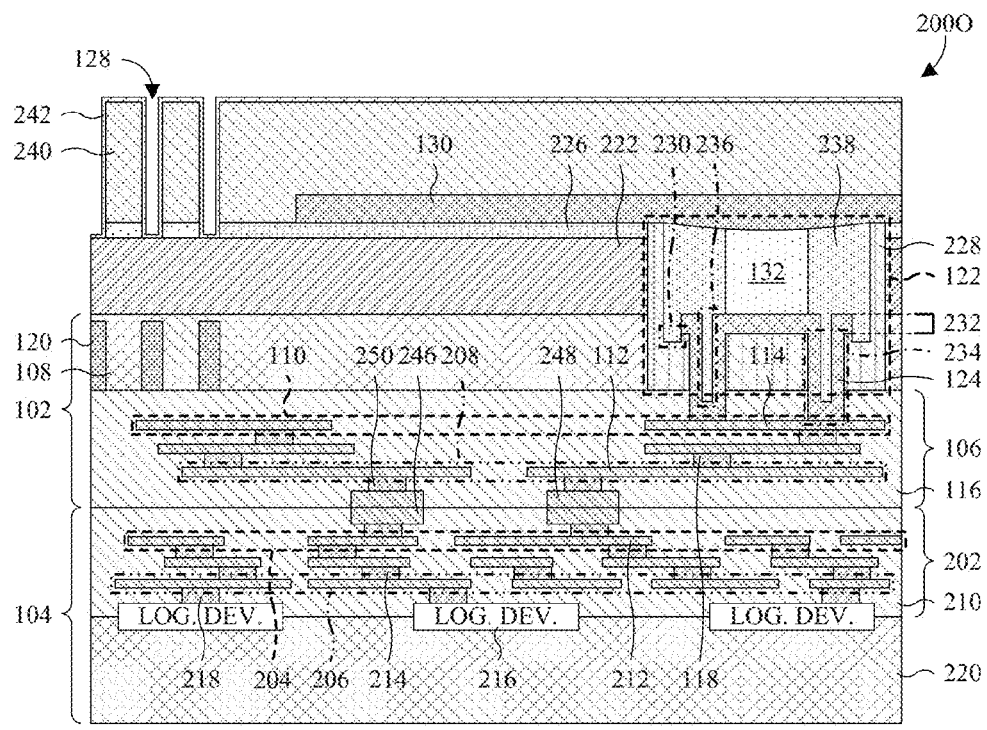
Figure 2P:
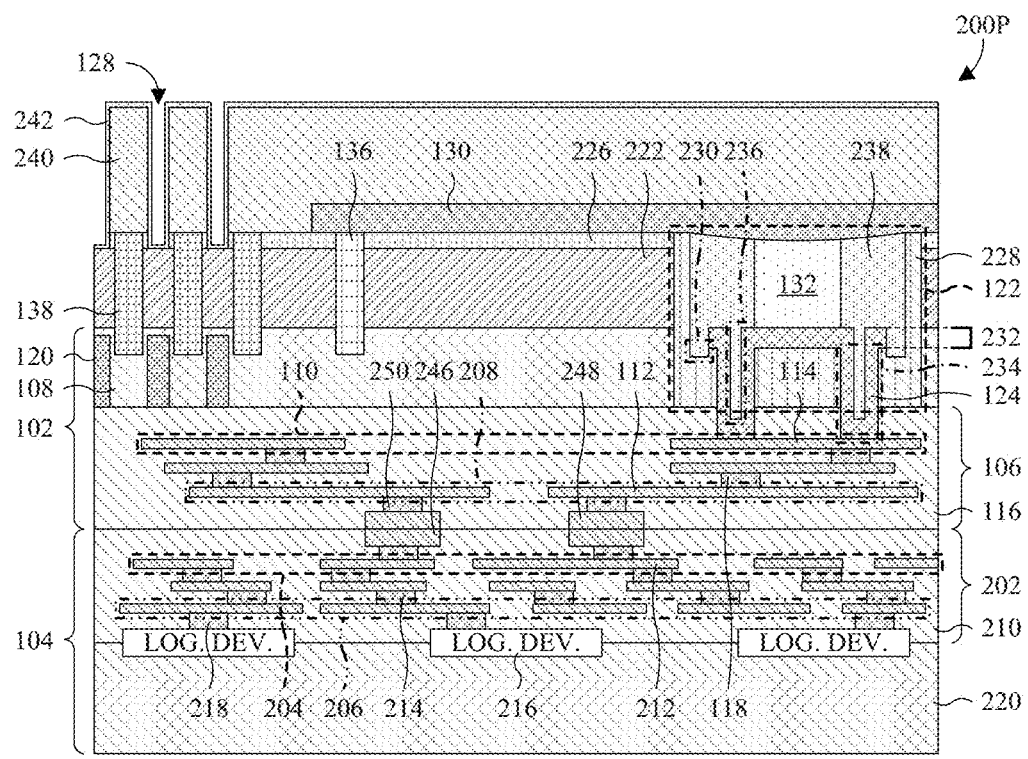
Figure 2Q:
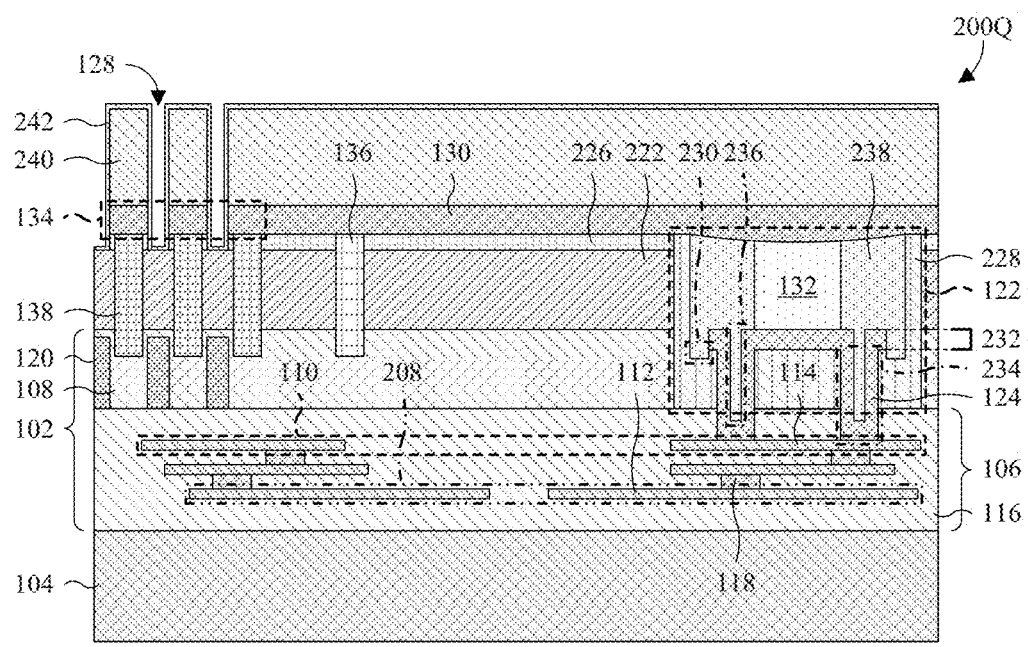
Figure 2R:
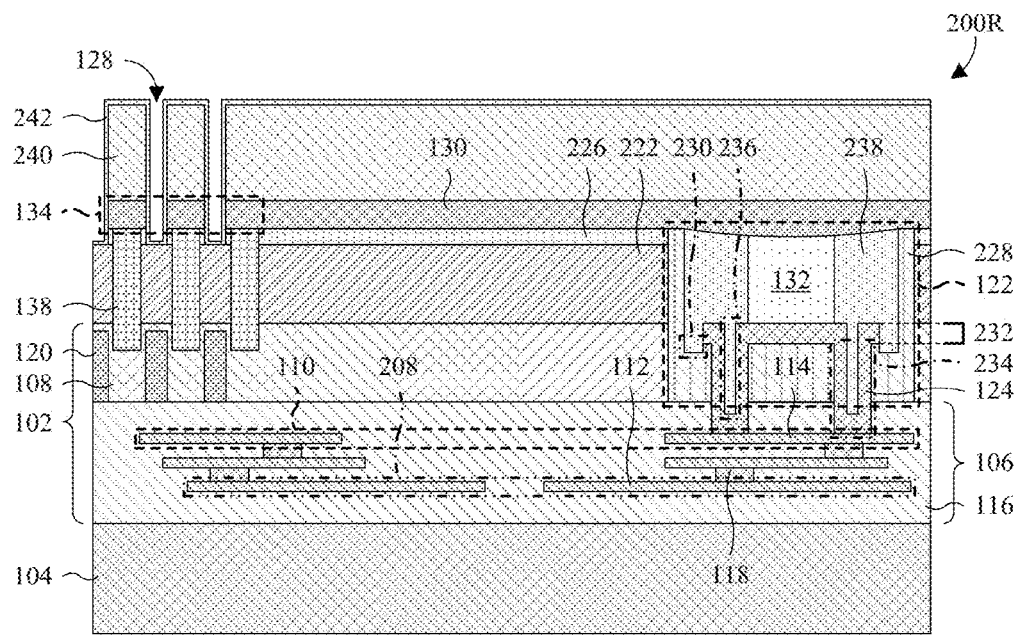
Figure 2S:
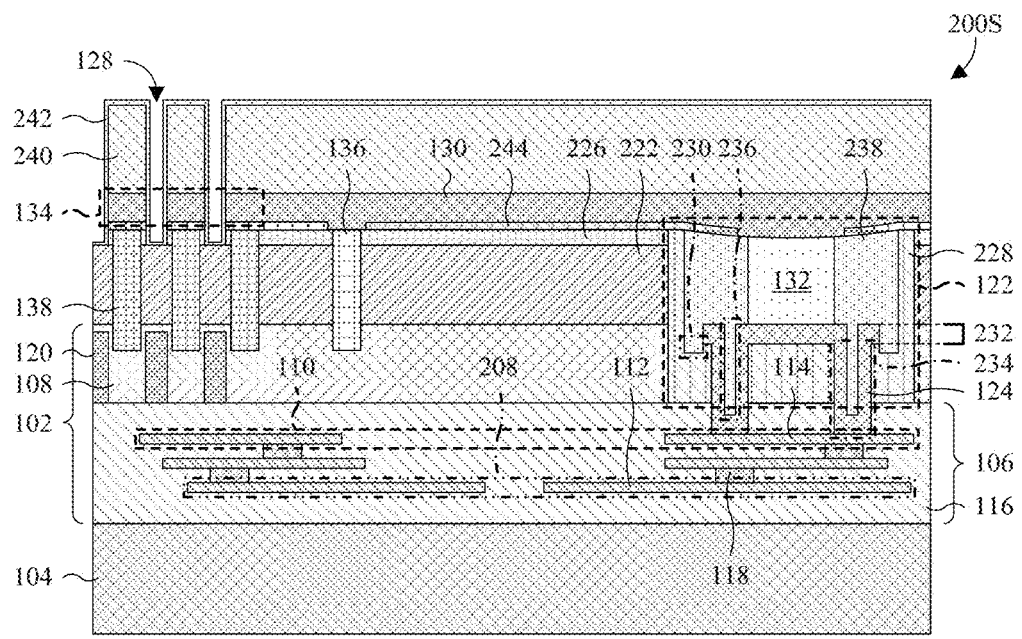
Figure 2T:
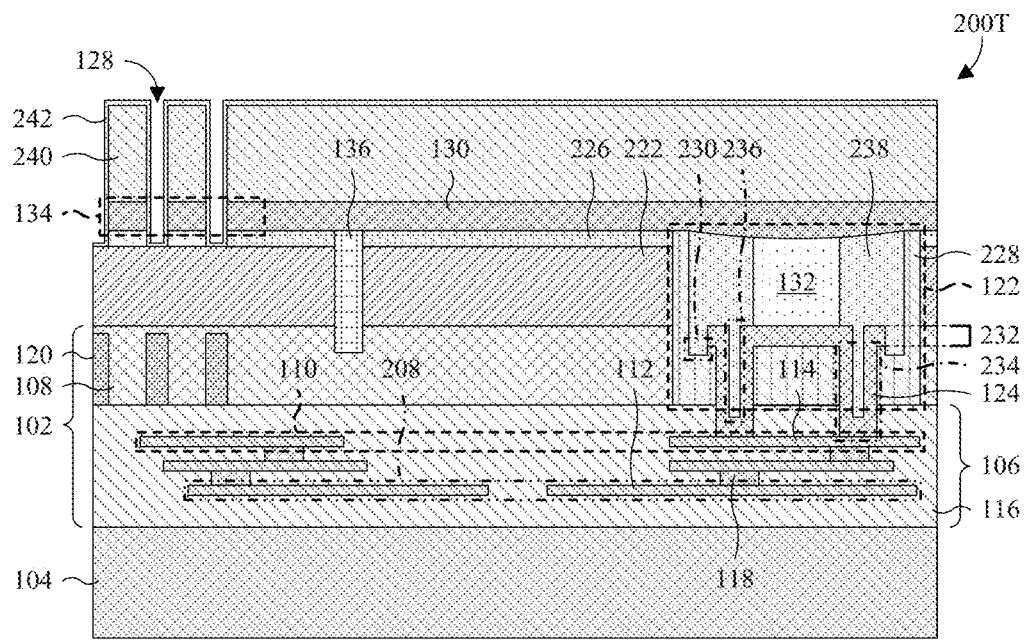
Figure 2U:
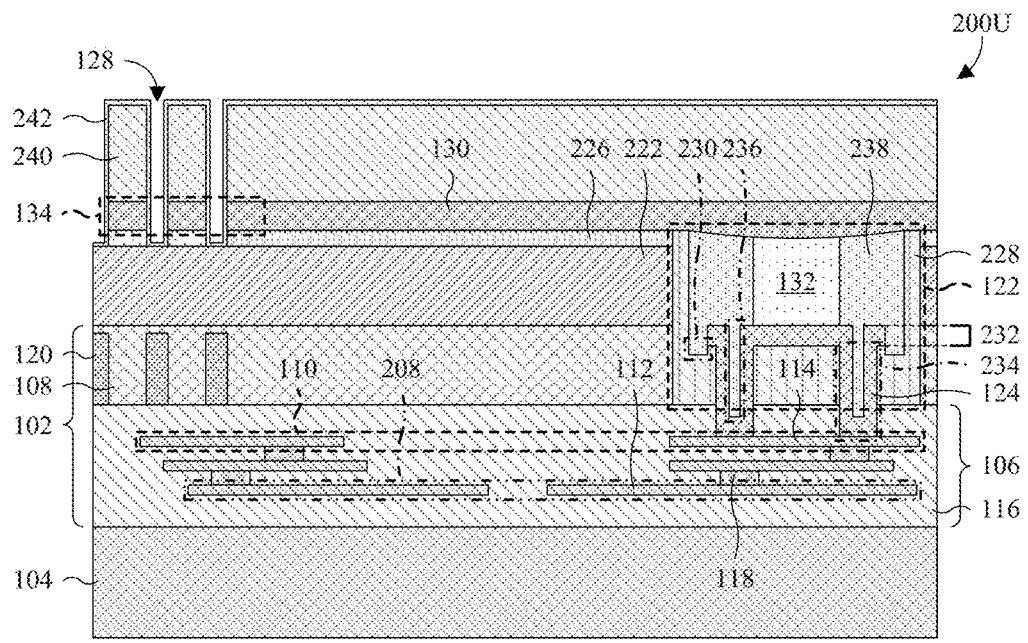
Figure 2V:
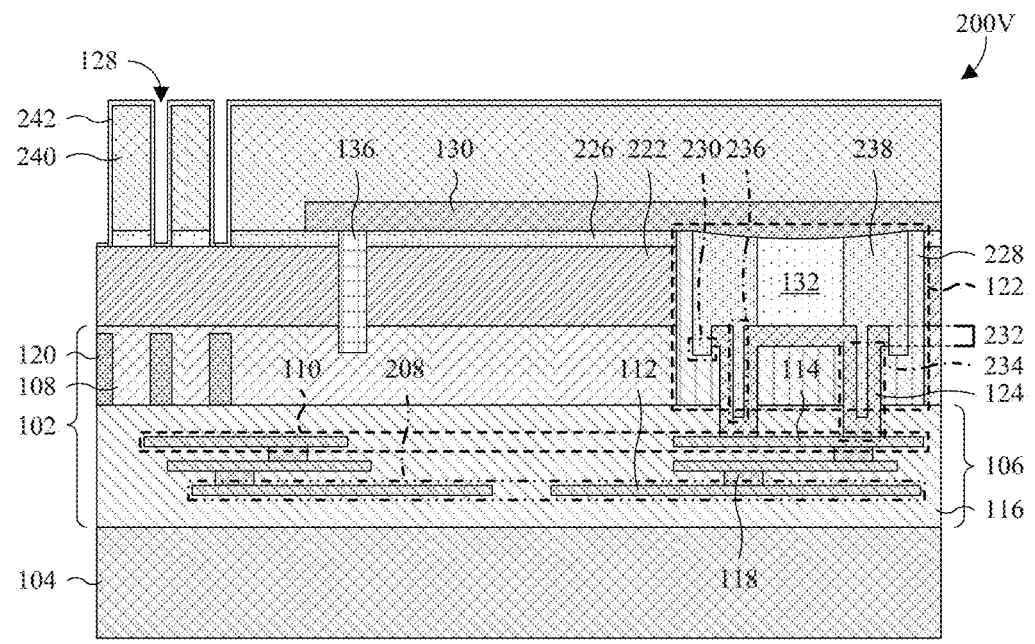
Figure 2W:
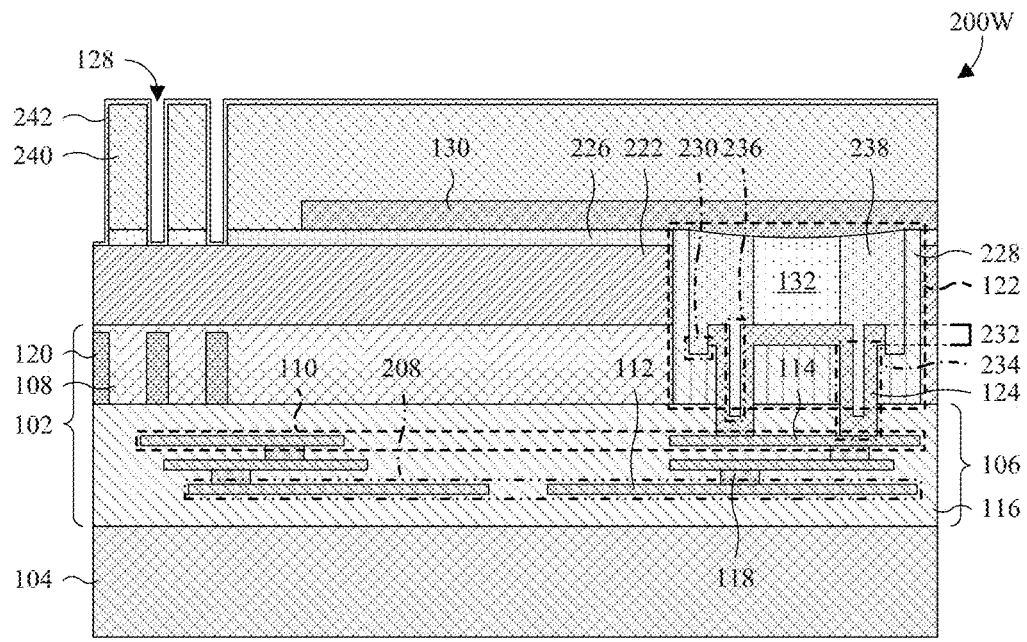
Figure 2X:
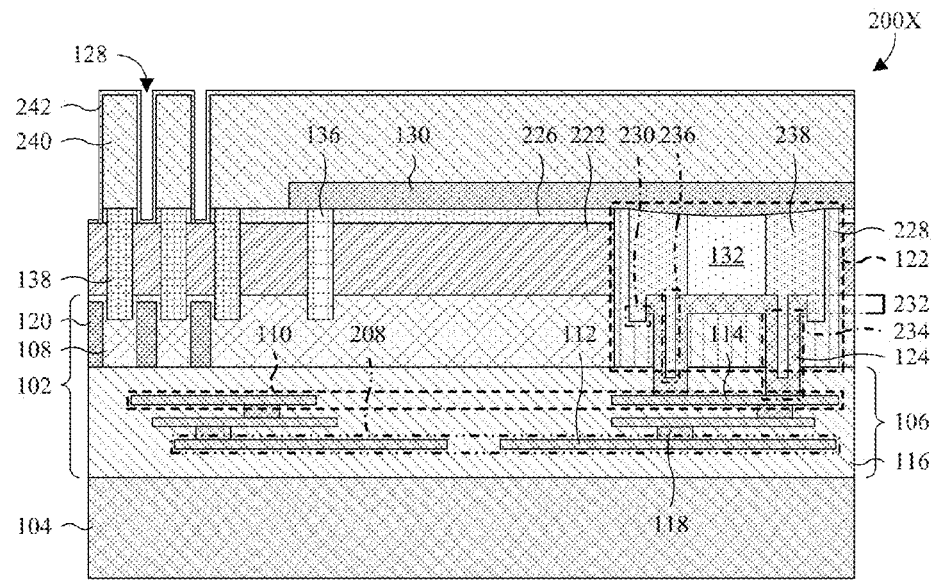

With reference to FIGS. 2A-2X, cross-sectional views 200A-200X of some more detailed embodiments of the BSI image sensor of FIG. 1 are provided As illustrated by the cross-sectional view 200A of FIG. 2A, a support structure 104 is an IC chip and supports a sensor chip 102 thereover. The support structure 104 is bonded to the sensor chip 102 at an interface between respective first and second interconnect structures 202, 106 of the support structure 104 and the sensor chip 102. In some embodiments, the support structure 104 is fusion bonded to the sensor chip 102 at the interface between the first and second interconnect structures 202, 106.

The first and second interconnect structures 202, 106 comprise respective interconnect layers 204, 206, 110, 208 vertically stacked within respective ILD regions 210, 116. The ILD regions 210, 116 may be, for example, silicon dioxide, a low κ dielectric (i.e., a dielectric with a dielectric constant κ less than about 3.9), or some other dielectric. The interconnect layers 204, 206, 110, 208 are defined by respective conductive features 212, 112, 114, such as conductive lines, and are electrically coupled to one another by interconnect vias 118, 214 extending between neighboring interconnect layers. Further, the interconnect layers 204, 206, 110, 208 are electrically coupled to electronic devices 216 of the support structure 104 and the sensor chip 102 by contact vias 218 extending between the electronic devices 216 and interconnect layers 206, 110 neighboring the electronic devices 216. The interconnect layers 204, 206, 110, 208, the conductive features 212, 112, 114, the contact vias 218, and the interconnect vias 118, 214 may be, for example, a metal, such as copper, aluminum, or tungsten, doped polysilicon, or some other conductive material. Further, only some of the interconnect layers 204, 206, 110, 208, one of the contact vias 218, some the interconnect vias 118, 214, and some of the conductive features 212, 112, 114 are labeled for ease of illustration.

The electronic devices 216 are arranged on respective first and second semiconductor substrates 220, 108 of the support structure 104 and the sensor chip 102, between the first and second semiconductor substrates 220, 108 and the first and second interconnect structures 202, 106. The electronic devices 216 may be, for example, logic devices, such as transistors, capacitors, or memory cells. For ease of illustration, only one of the electronic devices 216 is labeled. The first semiconductor substrate 220 underlies the first interconnect structure 202, and the second semiconductor substrate 108 overlies the second interconnect structure 106. The first and second semiconductor substrates 220, 108 may be, for example, bulk substrates of silicon or some other semiconductor material.

An array of photodetectors 120 is arranged in the second semiconductor substrate 108, and a first dielectric layer 222 covers the second semiconductor substrate 108. For ease of illustration, only one of the photodetectors 120 is labeled.

The photodetectors 120 may be, for example, doped regions of an opposite doping type (e.g., n-type or p-type) as surrounding regions of the second semiconductor substrate 108 to define respective PN junctions at interfaces between the photodetectors 120 and the surrounding regions. The first dielectric layer 222 may be, for example, silicon dioxide, a high κ dielectric (i.e., a dielectric with a dielectric constant κ greater than about 3.9), some other dielectric, or a combination of the foregoing.

A TIV 224 extends through the first dielectric layer 222, the second semiconductor substrate 108, and the second interconnect structure 106 to a first conductive feature 212 of the first interconnect structure 202. Further, the TIV 224 laterally contacts a second conductive feature 112 of the second interconnect structure 106 to electrically couple the first and second conductive features 212, 112. In some embodiments, an upper or top surface of the TIV 224 is coplanar with an upper or top surface of first dielectric layer 222. Further, in some embodiments, a width W of the TIV 224 discretely tapers at an interface between the second semiconductor substrate 108 and the second interconnect structure 106. The TIV 224 may be, for example, metal, such as copper, or some other conductive material.

A second dielectric layer 226 covers the first dielectric layer 222 and the TIV 224, and a ground structure 136, a BDTI structure 138, and a peripheral opening 122 extend into the second semiconductor substrate 108 through the first and second dielectric layers 222, 226. The second dielectric layer 226 may be, for example, silicon nitride or some other dielectric. The ground structure 136 is arranged laterally between the array of photodetectors 120 and the TIV 224, and the BDTI structure 138 is arranged laterally between the photodetectors 120 according to a grid pattern to provide optical isolation between the photodetectors 120. In some embodiments, the ground structure 136 extends laterally (not shown) to contact and electrically couple with the BDTI structure 138. Further, in some embodiments, upper or top surfaces of the BDTI structure 138 and the ground structure 136 are coplanar with an upper or top surface of the second dielectric layer 226. The peripheral opening 122 is laterally arranged on an opposite side of the TIV 224 as the BDTI structure 138 and the ground structure 136, and is further arranged at a peripheral of the second semiconductor substrate 108.

A third dielectric layer 228 lines the peripheral opening 122, and a pad structure 124 is arranged in the peripheral opening 122 over the third dielectric layer 228. The third dielectric layer 228 is confined to the peripheral opening 122 and may be, for example, silicon dioxide or some other dielectric. In some embodiments, the third dielectric layer 228 has a lower surface with recesses 230 respectively arranged on opposing sides of the pad structure 124, and/or has an upper or top surface that is coplanar with the upper or top surface of the second dielectric layer 226. For ease of illustration, only one of the recesses 230 is labeled.

The pad structure 124 includes a base region 232 and a protruding region 234 underlying the base region 232. The base region 232 is confined to the peripheral opening 122, and is arranged on the lower surface of the third dielectric layer 228. Further, the base region 232 has sidewall surfaces laterally spaced from neighboring sidewall surfaces of the third dielectric layer 228. The protruding region 234 is laterally arranged on the opposing sides of the pad structure 124 and protrudes from the base region 232, through the third dielectric layer 228 and a lower surface of the peripheral opening 122, to a third conductive feature 114 of the second interconnect structure 106. The third conductive feature 114 is electrically coupled to the second conductive feature 112 of the second interconnect structure 106, such that the pad structure 124 is electrically coupled to the support structure 104 by way of the TIV 224. In some embodiments, the pad structure 124 further includes pad openings 236 extending through the base region 232, into the protruding region 234, respectively on the opposing sides of the pad structure 124. The pad structure 124 may be, for example, metal, such as aluminum copper, or some other conductive material. For ease of illustration, the protruding region 234 is only partially highlighted by a dashed box, and only one of the pad openings 236 is labeled.

A fourth dielectric layer 238 fills the peripheral opening 122 over the pad structure 124, and a conductive layer 130 is arranged over the fourth dielectric layer 238. The fourth dielectric layer 238 may be, for example, silicon dioxide or some other dielectric. Further, the fourth dielectric layer 238 may have an upper or top surface that is concave and/or about even with the upper or top surface of the second dielectric layer 226. The conductive layer 130 is electrically coupled to the pad structure 124 by a plug structure 132 extending from the conductive layer 130, through the fourth dielectric layer 238, to the pad structure 124. Further, the conductive layer 130 extends laterally from over the fourth dielectric layer 238 to over the BDTI structure 138 and the ground structure 136, and is electrically coupled to the BDTI structure 138 and the ground structure 136. In some embodiments, the conductive layer 130 is electrically coupled with the BDTI structure 138 and/or the ground structure 136 by direct contact. The conductive layer 130 and the plug structure 132 may be, for example, a metal, such as tungsten or copper, or some other conductive material.

A backside shield structure 134 of the conductive layer 130 is arranged over and electrically coupled to the BDTI structure 138, and is arranged laterally between color filter openings 128 according to a grid pattern, to provide optical isolation between the photodetectors 120 and/or the color filter openings 128. For ease of illustration, only one of the color filter openings 128 is labeled. In some embodiments, the backside shield structure 134 directly contacts the BDTI structure 138. The color filter openings 128 overlap respective ones of the photodetectors 120, and extend to the first dielectric layer 222 through the conductive layer 130, the second dielectric layer 226, and a fifth dielectric layer 240 covering the conductive layer 130. Further, the color filter openings 128 are configured to accommodate color filters (not shown) corresponding to the photodetectors 120, and are lined by a sixth dielectric layer 242. The fifth and sixth dielectric layers 240, 242 may comprise, for example, silicon dioxide, silicon oxynitride, some other dielectric, or a combination of the foregoing.

By electrically coupling the pad structure 124 to the support structure 104, the pad structure 124 may be grounded or otherwise biased through the support structure 104. Further, by electrically coupling the BDTI structure 138, the backside shield structure 134, and the ground structure 136 to the pad structure 124 through the conductive layer 130, the BDTI structure 138, the backside shield structure 134, and the ground structure 136 may be grounded or otherwise biased. Advantageously, grounding or otherwise biasing the BDTI structure 138, the backside shield structure 134, and the ground structure 136 allows leakage current to be minimized between the photodetectors 120.

As illustrated by the cross-sectional view 200B of FIG. 2B, a variant of FIG. 2A is provided in which a ground structure 136 is omitted.

As illustrated by the cross-sectional view 200C of FIG. 2C, a variant of FIG. 2A is provided in which a seventh dielectric layer 244 is interposed between a conductive layer 130 and a BDTI structure 138 underlying the conductive layer 130 to space and electrically insulate the conductive layer 130 from the BDTI structure 138. The seventh dielectric layer 244 may be, for example, silicon dioxide or some other dielectric. The conductive layer 130 protrudes through the seventh dielectric layer 244 to electrically couple with a plug structure 132 and a ground structure 136 both underlying the conductive layer 130. In some embodiments, the conductive layer 130 protrudes through the seventh dielectric layer 244 to directly contact the plug structure 132 and/or the ground structure 136. The plug structure 132 extends vertically to and electrically couples with a pad structure 124, and the ground structure 136 extends (not shown) laterally to and electrically couples with the BDTI structure 138. As such that the BDTI structure 138 is electrically coupled to the conductive layer 130 and the pad structure 124 through the ground structure 136. In some embodiments, the plug structure 132 directly contacts the pad structure 124, and/or the ground structure 136 directly contacts the BDTI structure 138.

As illustrated by the cross-sectional view 200D of FIG. 2D, a variant of FIG. 2A is provided in which a BDTI structure 138 is omitted.

As illustrated by the cross-sectional view 200E of FIG. 2E, a variant of FIG. 2A is provided in which a ground structure 136 and a BDTI structure 138 are omitted.

As illustrated by the cross-sectional view 200F of FIG. 2F, a variant of FIG. 2A is provided in which a backside shield structure 134 and a BDTI structure 138 are omitted.

As illustrated by the cross-sectional view 200G of FIG. 2G, a variant of FIG. 2A is provided in which a backside shield structure 134, a ground structure 136, and a BDTI structure 138 are omitted. Further, a conductive layer 130 extends laterally from over a pad structure 124 to a location laterally between an array of photodetectors 120 and a TIV 224 electrically coupling the pad structure 124 to a support structure 104.

As illustrated by the cross-sectional view 200H of FIG. 2H, a variant of FIG. 2A is provided in which a backside shield structure 134 is omitted. Further, in some embodiments, a ground structure 136 extends laterally (not shown) to a BDTI structure 138 and electrically couples with the BDTI structure 138.

As illustrated by the cross-sectional view 200I of FIG. 2I, a variant of FIG. 2A is provided in which a sensor chip 102 is hybrid bonded to a support structure 104 underlying the sensor chip 102. A hybrid bond comprises two or more bonds, such as, for example, a bond between dielectrics and a bond between metals. Further, compared to FIG. 2A, a TIV 224 electrically coupling the sensor chip 102 to the support structure 104 is omitted. Instead, the sensor chip 102 is electrically coupled to the support structure 104 by respective first and second bond pads 246, 248 of the support structure 104 and the sensor chip 102 that are arranged at an interface between the sensor chip 102 and the support structure 104.

The first and second bond pads 246, 248 are arranged in respective ILD regions 210, 116 of the support structure 104 and the sensor chip 102. Further, the first and second bond pads 246, 248 are electrically coupled to neighboring interconnect layers 204, 208 of the support structure 104 and the sensor chip 102 by additional interconnect vias 250 extending between the first and second bond pads 246, 248 and the neighboring interconnect layers 204, 208. Surfaces of the first and second bond pads 246, 248 are arranged at the interface between the sensor chip 102 and the support structure 104, and surfaces of the first bond pads 246 contact opposing surfaces of the second bond pads 248 to electrically couple with the second bond pads 248. The first and second bond pads 246, 248 and the additional interconnect vias 250 may be, for example, a metal, such as tungsten or copper, or some other conductive material. Further, for ease of illustration, only some of the first and second bond pads 246, 248 and some of the additional interconnect vias 250 are labeled.

By electrically coupling the first and second bond pads 246, 248 at the interface between the support structure 104 and the sensor chip 102, the pad structure 124 may be grounded or otherwise biased through the support structure 104. Further, by electrically coupling a BDTI structure 138, a backside shield structure 134, and a ground structure 136 to the pad structure 124 through a conductive layer 130 arranged thereover, the BDTI structure 138, the backside shield structure 134, and the ground structure 136 may be grounded or otherwise biased. Advantageously, grounding or otherwise biasing the BDTI structure 138, the backside shield structure 134, and the ground structure 136 allows leakage current to be minimized between photodetectors 120 of the sensor chip 102.

As illustrated by the cross-sectional view 200J of FIG. 2J, a variant of FIG. 2I is provided in which a ground structure 136 is omitted.

As illustrated by the cross-sectional view 200K of FIG. 2K, a variant of FIG. 2I is provided in which a seventh dielectric layer 244 is interposed between a conductive layer 130 and a BDTI structure 138 underlying the conductive layer 130 to space and electrically insulate the conductive layer 130 from the BDTI structure 138. The conductive layer 130 protrudes through the seventh dielectric layer 244 to electrically couple with a plug structure 132 and a ground structure 136 both underlying the conductive layer 130. The plug structure 132 extends vertically to and electrically couples with a pad structure 124 and, in some embodiments, the ground structure 136 extends laterally (not shown) to and electrically couples with the BDTI structure 138.

As illustrated by the cross-sectional view 200L of FIG. 2L, a variant of FIG. 2I is provided in which a BDTI structure 138 is omitted.

As illustrated by the cross-sectional view 200M of FIG. 2M, a variant of FIG. 2I is provided in which a ground structure 136 and a BDTI structure 138 are omitted.

As illustrated by the cross-sectional view 200N of FIG. 2N, a variant of FIG. 2I is provided in which a backside shield structure 134 and a BDTI structure 138 are omitted.

As illustrated by the cross-sectional view 200O of FIG. 2O, a variant of FIG. 2I is provided in which a backside shield structure 134, a ground structure 136, and a BDTI structure 138 are omitted. Further, a conductive layer 130 extends laterally from over a pad structure 124 to a location arranged laterally adjacent to an array of photodetectors 120.

As illustrated by the cross-sectional view 200P of FIG. 2P, a variant of FIG. 2I is provided in which a backside shield structure 134 is omitted. Further, in some embodiments, a ground structure 136 extends laterally (not shown) to a BDTI structure 138 and electrically couples with the BDTI structure 138.

As illustrated by the cross-sectional view 200Q of FIG. 2Q, a variant of FIG. 2A is provided in which a support structure 104 is a carrier substrate and a TIV 224 electrically coupling the sensor chip 102 to the support structure 104 is omitted. Further, in some embodiments, a pad structure 124 is electrically coupled to a neighboring pad structure (not shown) through an interconnect structure 106 arranged under the pad structure 124.

By electrically coupling the pad structure 124 to a neighboring pad structure, the pad structure 124 may be grounded or otherwise biased through the neighboring pad structure. Further, by electrically coupling a BDTI structure 138, a backside shield structure 134, and a ground structure 136 to the pad structure 124 through a conductive layer 130 arranged thereover, the BDTI structure 138, the backside shield structure 134, and the ground structure 136 may be grounded or otherwise biased. Advantageously, grounding or otherwise biasing the BDTI structure 138, the backside shield structure 134, and the ground structure 136 allows leakage current to be minimized between photodetectors 120 of the sensor chip 102.

As illustrated by the cross-sectional view 200R of FIG. 2R, a variant of FIG. 2Q is provided in which a ground structure 136 is omitted.

As illustrated by the cross-sectional view 200S of FIG. 2S, a variant of FIG. 2Q is provided in which a seventh dielectric layer 244 is interposed between a conductive layer 130 and a BDTI structure 138 underlying the conductive layer 130 to space and electrically insulate the conductive layer 130 from the BDTI structure 138. The conductive layer 130 protrudes through the seventh dielectric layer 244 to electrically couple with a plug structure 132 and a ground structure 136 both underlying the conductive layer 130. The plug structure 132 extends vertically to and electrically couples with a pad structure 124 and, in some embodiments, the ground structure 136 extends laterally (not shown) to and electrically couples with the BDTI structure 138.

As illustrated by the cross-sectional view 200T of FIG. 2T, a variant of FIG. 2Q is provided in which a BDTI structure 138 is omitted.

As illustrated by the cross-sectional view 200U of FIG. 2U, a variant of FIG. 2Q is provided in which a ground structure 136 and a BDTI structure 138 are omitted.

As illustrated by the cross-sectional view 200V of FIG. 2V, a variant of FIG. 2Q is provided in which a backside shield structure 134 and a BDTI structure 138 are omitted.

As illustrated by the cross-sectional view 200W of FIG. 2W, a variant of FIG. 2Q is provided in which a backside shield structure 134, a ground structure 136, and a BDTI structure 138 are omitted. Further, a conductive layer 130 extends laterally from over a pad structure 124 to a location arranged laterally adjacent to an array of photodetectors 120.

As illustrated by the cross-sectional view 200X of FIG. 2X, a variant of FIG. 2Q is provided in which a backside shield structure 134 is omitted. Further, in some embodiments, a ground structure 136 extends laterally (not shown) to a BDTI structure 138 and electrically couples with the BDTI structure 138.

Figure 3A:
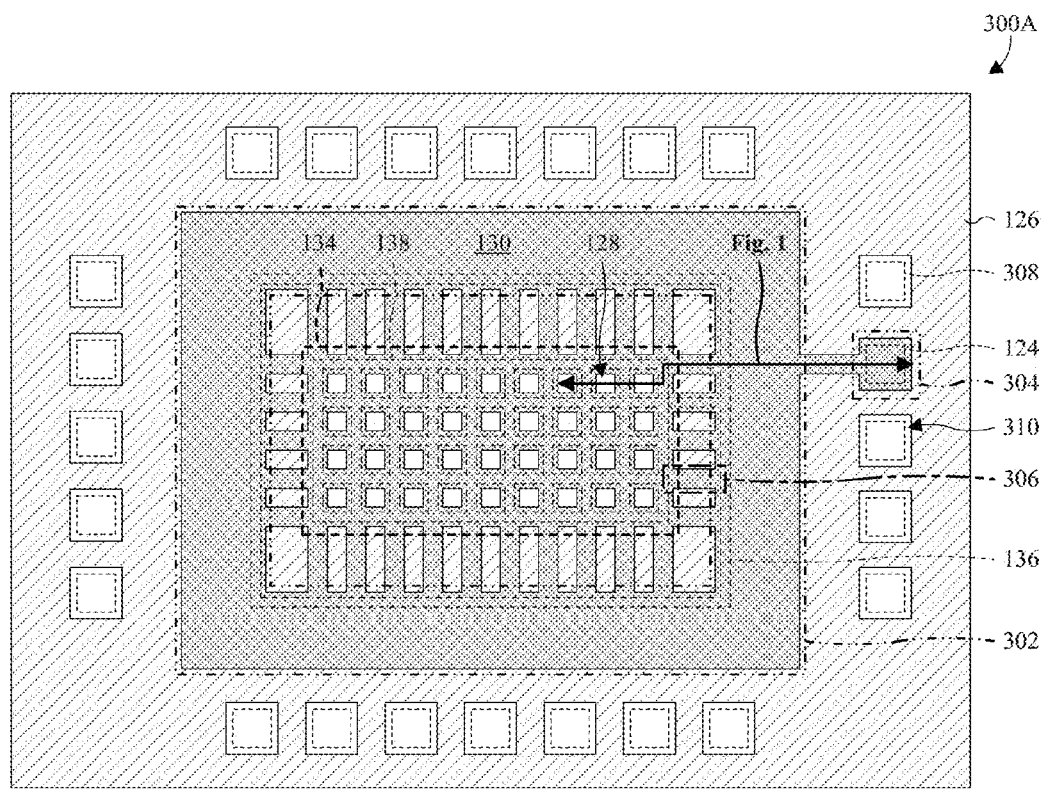
FIGS. 3A and 3B illustrate top views of some embodiments of the BSI image sensor of FIG. 1.
Figure 3B:
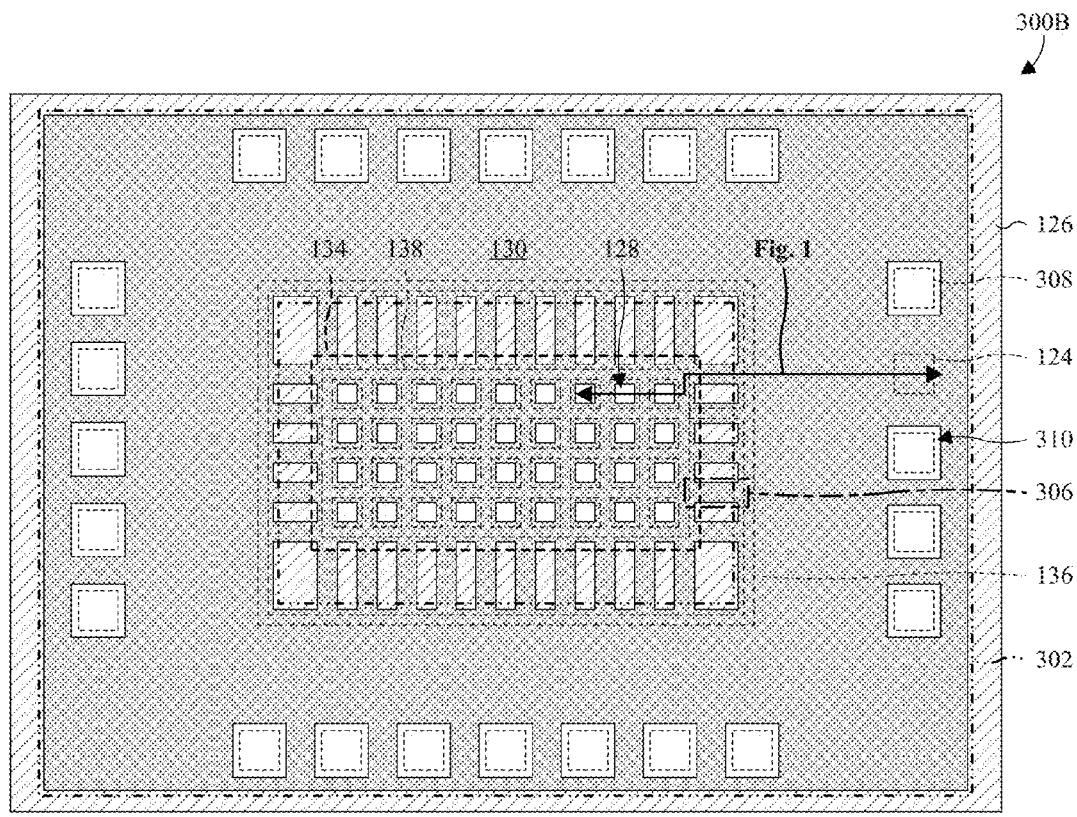

With reference to FIGS. 3A and 3B, top views 300A, 300B of some embodiments of the BSI image sensor of FIG. 1 are provided. The top views 300A, 300B may, for example, be taken along a horizontal plane bisecting a thickness (i.e., a distance between top and bottom surfaces) of a conductive layer 130 in the BSI image sensor of FIG. 1.

As illustrated by the top view 300A of FIG. 3A, the conductive layer 130 is arranged over a dielectric region 126, and comprises an enclosing structure 302, a contact structure 304, and a backside shield structure 134. The enclosing structure 302, the contact structure 304, and the backside shield structure 134 are laterally spaced from one another, and electrically coupled to one another by lateral extensions 306 of the conductive layer 130 extending from the enclosing structure 302 to the contact structure 304 and to the backside shield structure 134. For ease of illustration, only one of the lateral extensions 306 is labeled.

The enclosing structure 302 laterally surrounds the backside shield structure 134 and is arranged laterally between the contact structure 304 and the backside shield structure 134. The enclosing structure 302 may have, for example, a square-ring-shaped footprint. A footprint may be, for example, a two-dimensional projection onto a horizontal plane. In some embodiments, the enclosing structure 302 is arranged over and electrically coupled to a ground structure 136 (shown in phantom). The ground structure 136 may have, for example, a square-shaped footprint, a square-ring-shaped footprint, or a circular footprint. Further, in some embodiments, the enclosing structure 302 is arranged over and electrically insulated from a TIV (not shown). The TIV may be, for example, arranged laterally between the ground structure 136 and an outer sidewall surface of the enclosing structure 302.

The contact structure 304 is arranged laterally adjacent to the enclosing structure 302, and is localized over and electrically coupled to a pad structure 124 (shown in phantom). The pad structure 124 is configured to ground or otherwise bias the contact structure 304, and hence the conductive layer 130. Further, the contact structure 304 is laterally spaced from additional pad structures 308 (shown in phantom) that laterally surround the enclosing structure 302. The additional pad structures 308 are arranged in the dielectric region 126, under pad openings 310 in the dielectric region 126. For ease of illustration, only one of the additional pad structures 308 and only one of the pad openings 310 are labeled.

The backside shield structure 134 is laterally spaced from the enclosing structure 302, and is arranged laterally between color filter openings 128 according to a grid pattern to provide optical isolation between the color filter openings 128. The color filter openings 128 correspond to photodetectors (not shown) underlying the color filter openings 128, and are configured to accommodate color filters (not shown) corresponding to the photodetectors. The color filter openings 128 and the color filters may correspond to the photodetectors with, for example, a one-to-one correspondence. The color filters are configured to transmit assigned colors or wavelengths of radiation, while filtering out other colors or wavelengths of radiation, and the photodetectors are configured to absorb incident radiation.

In some embodiments, a BDTI structure 138 (shown in phantom) is arranged under and electrically coupled to the backside shield structure 134. The BDTI structure 138 is arranged laterally between the photodetectors according to a grid pattern to provide optical isolation between the photodetectors. In some embodiments, the BDTI structure 138 is laterally offset from the of the backside shield structure 134. The lateral offset may be, for example, with respect to centroids of the BDTI structure 138 and the backside shield structure 134.

As illustrated by the top view 300B of FIG. 3B, a variant of FIG. 3A is provided in which a contact structure 304 of a conductive layer 130 is omitted. Further, an enclosing structure 302 of the conductive layer 130 is expanded to cover and electrically couple with a pad structure 124, and pad openings 310 overlying additional pad structures 308 are extended through the conductive layer 130.

While FIGS. 3A and 3B were illustrated and described as comprising a conductive layer 130 with a backside shield structure 134, the backside shield structure 134 may be omitted in alternative embodiments. Along with the backside shield structure 134, lateral extensions 306 extending laterally from an enclosing structure 302 of the conductive layer 130 to the backside shield structure 134 may also be omitted.

Figure 4A:
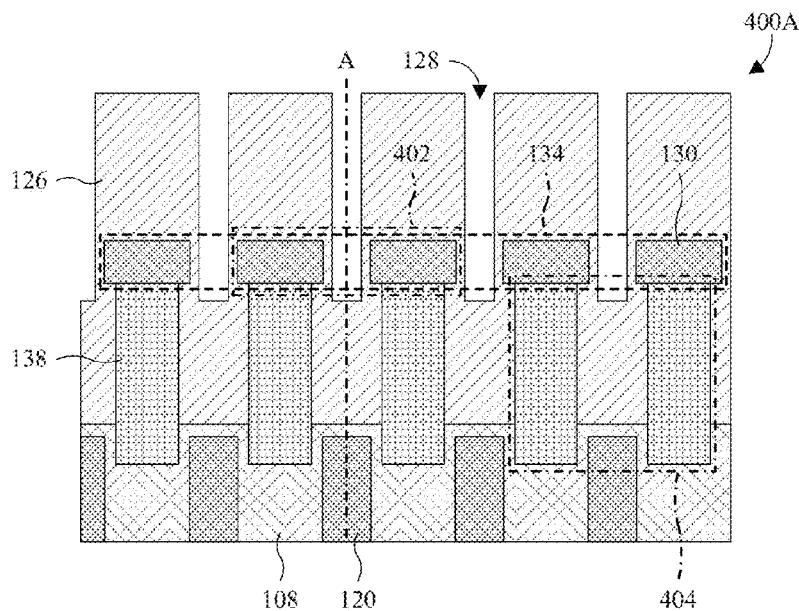
FIGS. 4A and 4B illustrate cross-sectional views of some embodiments of the BSI image sensor of FIG. 1 respectively without and with grid shift.
Figure 4B:
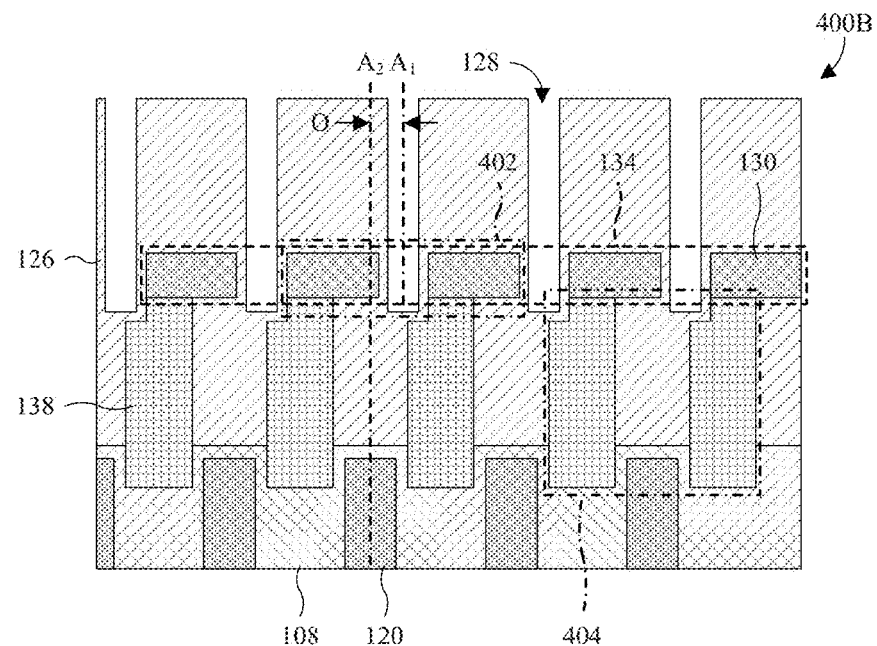

With reference to FIGS. 4A and 4B, cross-sectional views 400A, 400B of some embodiments of the BSI image sensor of FIG. 1 respectively without and with grid shift are provided.

As illustrated by the cross-sectional view 400A of FIG. 4A, a backside shield structure 134 of a conductive layer 130 overlies a BDTI structure 138. The backside shield structure 134 is arranged in a dielectric region 126, and is further arranged laterally between color filter openings 128 according to a first grid pattern. Further, the backside shield structure 134 is defined by first grid segments 402 that overlap to define the first grid pattern. The BDTI structure 138 extends through the dielectric region 126, into a semiconductor substrate 108 accommodating photodetectors 120, and is arranged laterally between the photodetectors 120 according to a second grid pattern. Further, the BDTI structure 138 is defined by second grid segments 404 that overlap to define the second grid pattern. For ease of illustration, only one of the photodetectors 120, only one of the color filter openings 128, only one of the first grid segments 402, and only one of the second grid segments 404 are labeled.

The first and second grid segments 402, 404 are respectively regions of the backside shield structure 134 and the BDTI structure 138 that laterally encloses respective openings (not labeled) and may have, for example, square-ring-shaped footprints. In some embodiments, the first grid segments 402 laterally enclose central openings accommodating some of the dielectric region 126 and the color filter openings 128, and/or the second grid segments 404 laterally enclose central openings accommodating the photodetectors 120. Further, the first grid segments 402 correspond to the second grid segments 404 and are vertically aligned with the corresponding second grid segments 404. In some embodiments, the correspondence between the first and second grid segments 402, 404 is one-to-one. Further, in some embodiments, the vertical alignment between the first and second grid segments 404 is with respect to centroids or outside edges of the first and second grid segments 402, 404. For example, a centroid of a first grid segment 402 may be vertically aligned to a centroid of a corresponding one (not labeled) of the second grid segments 404 along a vertical axis A.

As illustrated by the cross-sectional view 400B of FIG. 4B, a variant of FIG. 4B is provided in which first grid segments 402 defining a backside shield structure 134 are laterally shifted from second grid segments 404 defining a BDTI structure 138. For ease of illustration, only some of the first and second grid segments 402, 404 are labeled. In some embodiments, the lateral offset between the first and second grid segments 404 is with respect to centroids or outside edges of the first and second grid segments 402, 404. For example, a centroid of a first grid segment 402 and a centroid of a corresponding one (not labeled) of the second grid segments 404 may be respectively arranged at a first vertical axis $A_1$ and a second vertical axis $A_2$, and the first and second vertical axes $A_1$, $A_2$ may be laterally offset by an amount O.

With reference to FIGS. 5A-5C and 6-22, a series of cross-sectional views 500A-500C, 600-2200 of some embodiments of a method for manufacturing a BSI image sensor for biased BDTI and/or biased backside shielding is provided.

Figure 5A:
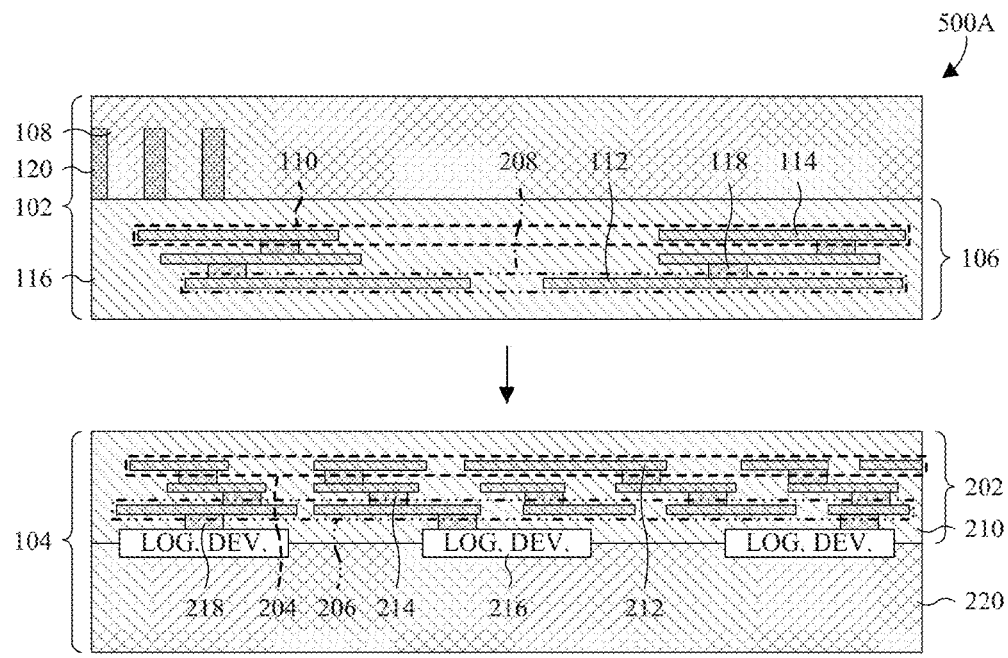
FIGS. 5A-5C and 6-22 illustrate a series of cross-sectional views of some embodiments of a method for manufacturing a BSI image sensor for biased BDTI and/or biased backside shielding.

As illustrated by the cross-sectional view 500A of FIG. 5A, a support structure 104 is an IC chip, and a sensor chip 102 is arranged over and bonded to the support structure 104. The support structure 104 and the sensor chip 102 are bonded by fusion bonding between respective first and second interconnect structures 202, 106 of the support structure 104 and the sensor chip 102. The first and second interconnect structures 202, 106 comprise respective interconnect layers 204, 206, 110, 208 vertically stacked within respective ILD regions 210, 116. The interconnect layers 204, 206, 110, 208 are defined by respective conductive features 212, 112, 114 and are electrically coupled to one another by interconnect vias 118, 214 extending between neighboring interconnect layers. Further, the interconnect layers 204, 206, 110, 208 are electrically coupled to electronic devices 216, such as logic devices, of the support structure 104 and the sensor chip 102 by contact vias 218 extending between the electronic devices 216 and interconnect layers 206, 110 neighboring the electronic devices 216. For ease of illustration, only some of the interconnect layers 204, 206, 110, 208, one of the contact vias 218, one the interconnect vias 118, 214, some of the conductive features 212, 112, 114, and one of the electronic devices 216 are labeled.

The electronic devices 216 are arranged on respective first and second semiconductor substrates 220, 108 of the support structure 104 and the sensor chip 102, between the first and second semiconductor substrates 220, 108 and the first and second interconnect structures 202, 106. The first semiconductor substrate 220 underlies the first interconnect structure 202, and the second semiconductor substrate 108 overlies the second interconnect structure 106. Further, an array of photodetectors 120 is arranged in the second semiconductor substrate 108. In some embodiments, the photodetectors 120 extend into the second semiconductor structure 108, away from the second interconnect structure 106, from an interface between the second interconnect structure 106 and the second semiconductor substrate 108.

Figure 5B:
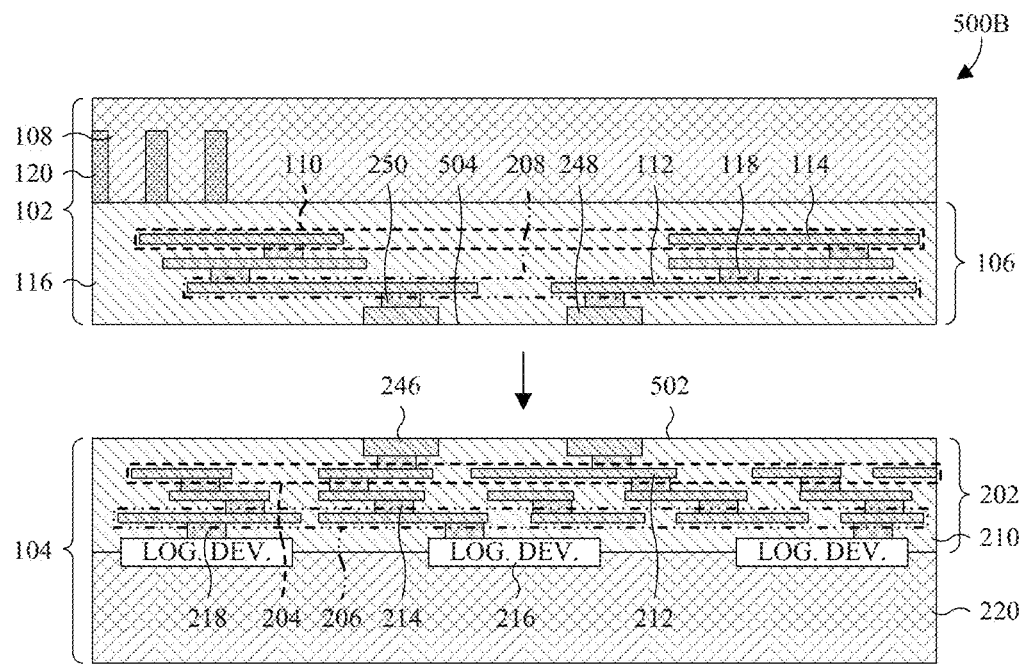

As illustrated by the cross-sectional view 500B of FIG. 5B, a variant of FIG. 5A is provided in which a sensor chip 102 is arranged over and bonded to a support structure 104 by hybrid bonding between respective first and second interconnect structures 202, 106 of the support structure 104 and the sensor chip 102. The first interconnect structure 202 is configured to bond through a first outer surface 502 and comprises first bond pads 246 arranged at the first outer surface 502. The second interconnect structure 106 is configured to bond through a second outer surface 504 and comprises second bond pads 248 arranged at the second outer surface 504. The first and second bond pads 246, 246 electrically coupled to neighboring interconnect layers 204, 208 of the support structure 104 and the sensor chip 102 by additional interconnect vias 250 extending between the first and second bond pads 246, 248 and the neighboring interconnect layers 204, 208. For ease of illustration, only some of the first and second bond pads 246, 248 and some of the additional interconnect vias 250 are labeled.

Figure 5C:
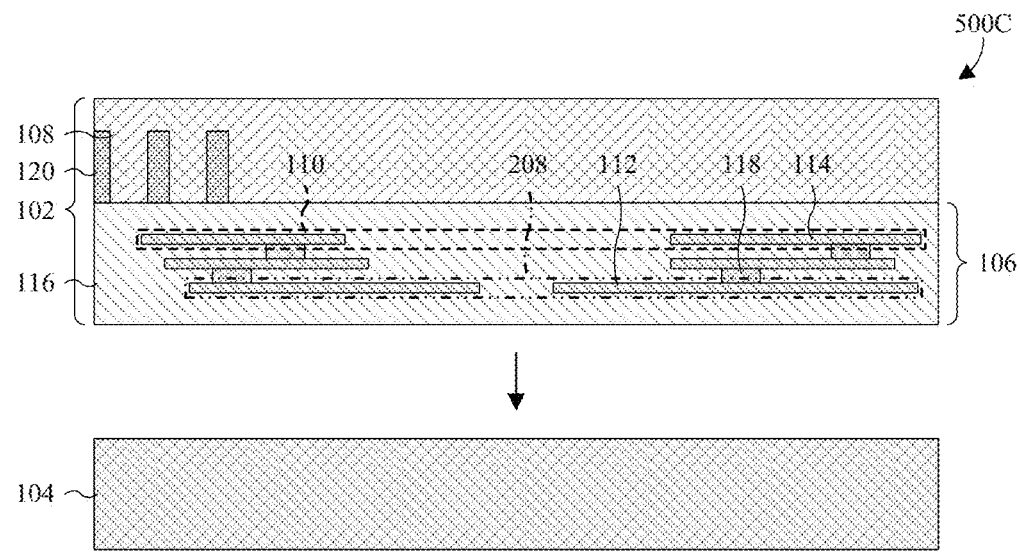

As illustrated by the cross-sectional view 500C of FIG. 5C, a variant of FIG. 5A is provided in which a support structure 104 is a bulk semiconductor substrate of silicon or another semiconductor material, and a sensor chip 102 is arranged over and bonded to the support structure 104. The sensor chip 102 is bonded to the support structure 104 by fusion bonding between an interconnect structure 106 of the sensor chip 102 and the support structure 104.

Hereafter, the support structure 104 is generically illustrated within FIGS. 6-22, except for those figures illustrating acts directed towards the embodiments of FIGS. 500A-500C. Notwithstanding that the support structure 104 is generically illustrated, the support structure 104 may take on the structure in one of FIGS. 500A-500C, and/or may be bonded to the sensor chip 102 as described in one of FIGS. 500A-500C.

Figure 6:
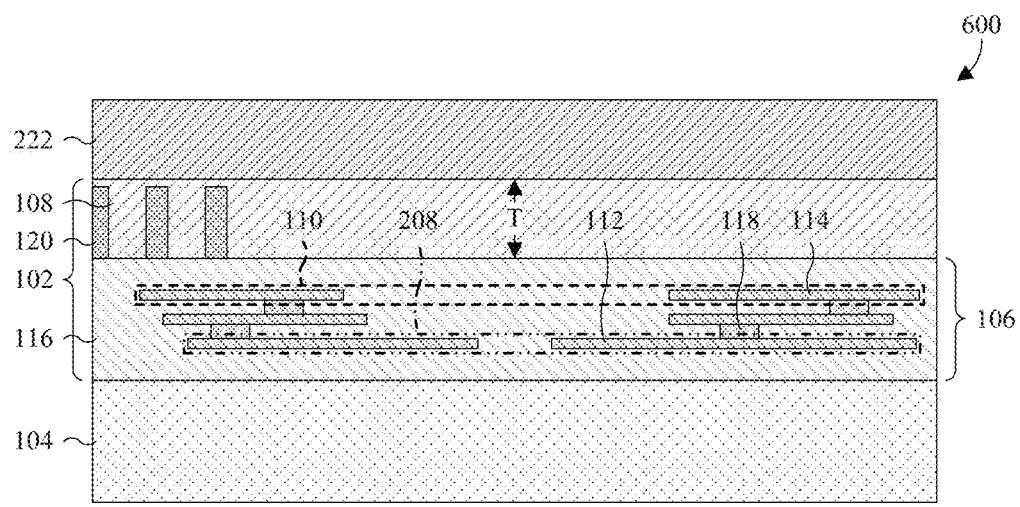

As illustrated by the cross-sectional view 600 of FIG. 6, the second semiconductor substrate 108 of the sensor chip 102 is thinned to a target thickness T. In some embodiments, the second semiconductor substrate 108 is thinned by a chemical mechanical polish (CMP) and/or an etch back into the second semiconductor substrate 108.

Also illustrated by FIG. 6, a first dielectric layer 222 is formed over the sensor chip 102. In some embodiments, the first dielectric layer 222 is formed of silicon dioxide, a high κ dielectric, plasma enhanced silicon oxide (PEOX), or combination of the foregoing. For example, the first dielectric layer 222 may comprise an oxide layer, a hafnium oxide layer overlying the oxide layer, a tantalum oxide layer overlying the hafnium oxide layer, and a PEOX layer overlying the tantalum oxide layer. Further, in some embodiments, the process for forming the first dielectric layer 222 comprises sequentially growing or otherwise depositing the one or more individual layers defining the first dielectric layer 222. The growing or depositing may be performed by, for example, thermal oxidation, chemical vapor deposition (CVD), physical vapor deposition (PVD), atomic layer deposition (ALD), or some other growth or deposition process.

Figure 7:
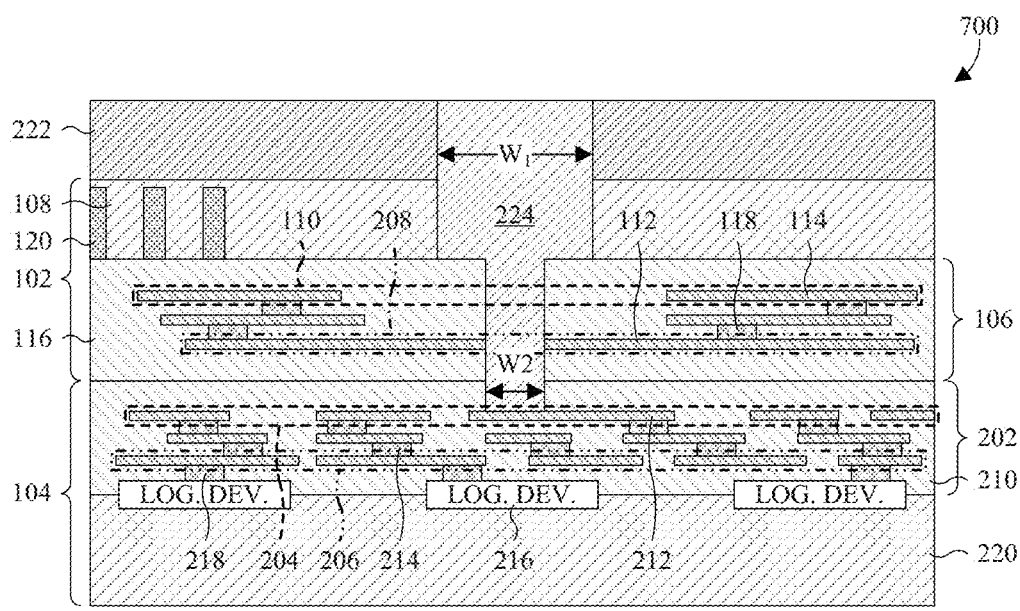

As illustrated by the cross-sectional view 700 of FIG. 7, in some embodiments, a TIV 224 is formed laterally adjacent to the array of photodetectors 120, and extending through the first dielectric layer 222 and the sensor chip 102 to an interconnect layer 204 of the support structure 104. Further, in some embodiments, the TIV 224 is formed with an upper or top surface that is coplanar with an upper or top surface of the first dielectric layer 222, and/or with a tapering width $W_1$, $W_2$.

In some embodiments, the process for forming the TIV 224 comprises performing a first etch into the first dielectric layer 222 and the second semiconductor substrate 108. The first etch is performed to form a first TIV opening exposing the ILD region 116 of the support structure 104 and having a first width $W_1$. Thereafter, a second etch is performed into the ILD regions 116, 210 of the sensor chip 102 and the support structure 104 through the first TIV opening. The second etch is performed to form a second TIV opening exposing the interconnect layer 204 of the support structure 104 and having a second width $W_2$ less than the first width $W_1$. The first and second etches may be performed by, for example, photolithography. With the first and second TIV openings formed, the openings are filled with a first conductive layer. In some embodiments, the first and second TIV openings may be filled by, for example, growing or otherwise depositing the first conductive layer. For example, the first conductive layer may be copper and grown or otherwise deposited by electro-copper plating (ECP). Further, in some embodiments, a diffusion barrier layer is formed lining the first and second TIV openings before filling the openings with the first conductive layer. After filling the first and second TIV openings, a planarization is performed into the first conductive layer to coplanarize upper or top surfaces of the first conductive layer and the first dielectric layer 222. In some embodiments, the planarization is performed by a CMP, and/or followed by an etch back.

Figure 8:
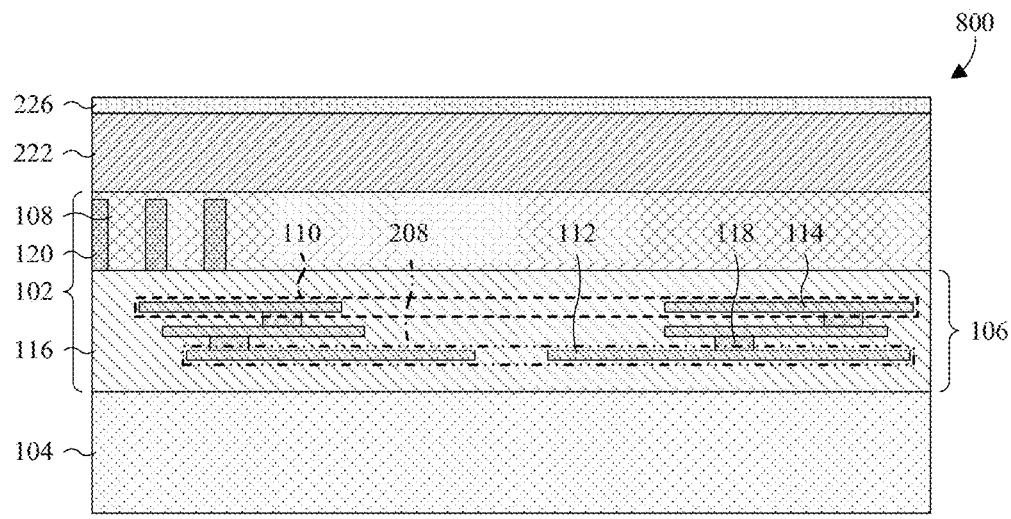

As illustrated by the cross-sectional view 800 of FIG. 8, a second dielectric layer 226 is formed over the first dielectric layer 222 and, in some embodiments, the TIV 224 (see, e.g., FIG. 7). Further, in some embodiments, the second dielectric layer 226 is formed of silicon nitride. The process for forming the second dielectric layer 226 may comprise, for example, growing or otherwise depositing the second dielectric layer 226. The growing or depositing may be performed by, for example, CVD, PVD, ALD, or some other growth or deposition process.

Figure 9:
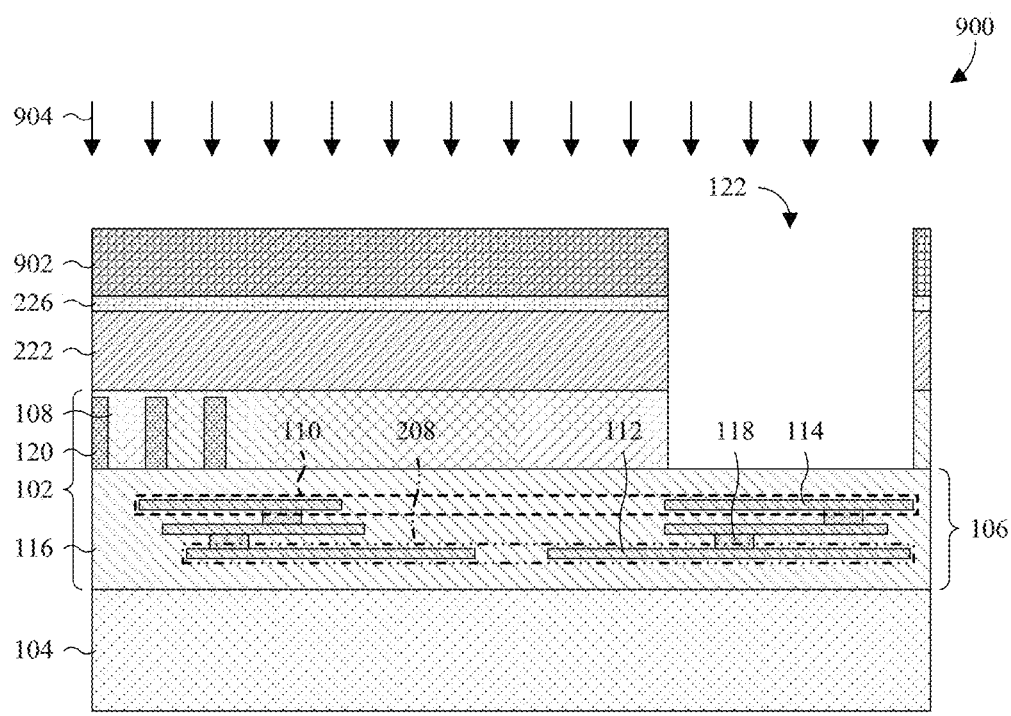

As illustrated by the cross-sectional view 900 of FIG. 9, a third etch is performed into the first and second dielectric layers 222, 226 and the semiconductor substrate 108 to form a peripheral opening 122 exposing an ILD region 116 of the sensor chip 102. Further, the third etch is performed to form the peripheral opening 122 laterally adjacent to the array of photodetectors 120 and, in some embodiments, on an opposite side of the TIV 224 (see, e.g., FIG. 7) as the photodetectors 120. In some embodiments, the process for performing the third etch comprises forming a first photoresist layer 902 on the second dielectric layer 226, and patterning the first photoresist layer 902 to laterally surround regions of the first and second dielectric layers 222, 226 and the semiconductor substrate 108 corresponding to the peripheral opening 122. Thereafter, one or more first etchants 904 are sequentially applied to the first and second dielectric layers 222, 226 and the semiconductor substrate 108, while using the first photoresist layer 802 as a mask, to form the peripheral opening 122. With the peripheral opening 122 formed, the first photoresist layer 802 is removed.

Figure 10:
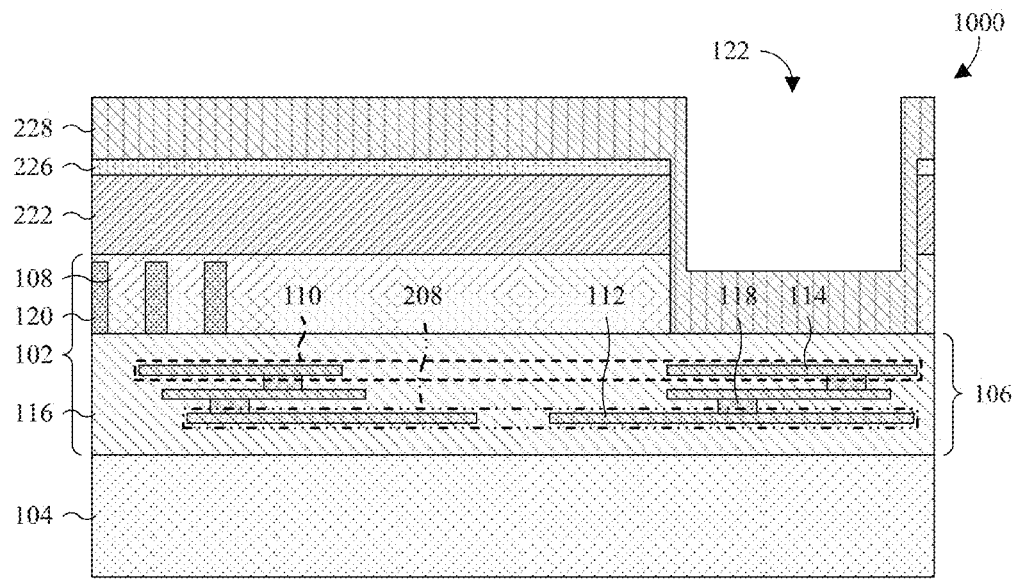

As illustrated by the cross-sectional view 1000 of FIG. 10, a third dielectric layer 228 is formed over the second dielectric layer 226 and lining the peripheral opening 122. In some embodiments, the third dielectric layer 228 is formed conformally, and/or is formed of silicon dioxide. Further, in some embodiments, the process for forming the third dielectric layer 228 comprises growing or otherwise depositing the third dielectric layer 228. The growing or depositing may be performed by, for example, CVD, PVD, ALD, thermal oxidation, or some other growth or deposition process.

Figure 11:
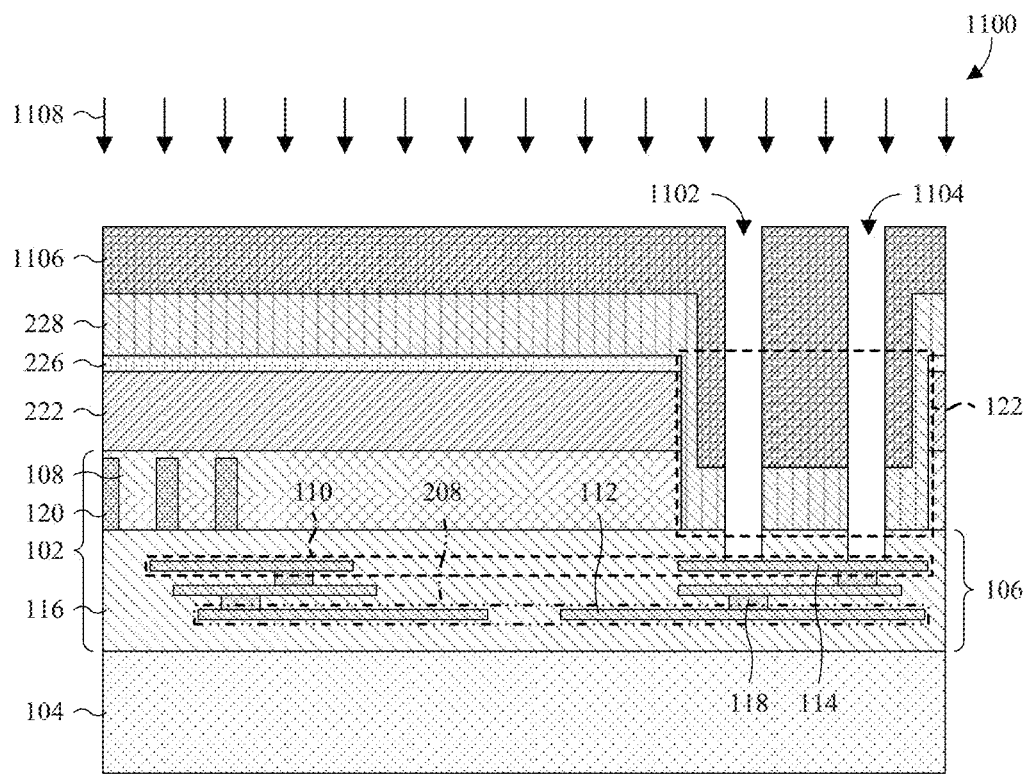

As illustrated by the cross-sectional view 1100 of FIG. 11, a fourth etch is performed into the third dielectric layer 228 and the ILD region 116 of the sensor chip 102, through the peripheral opening 122, to form one or more first pad openings 1102, 1104 exposing an interconnect layer 110 in the ILD region 116. The first pad opening(s) 1102, 1104 are formed laterally spaced and, in some embodiments, formed with line-shaped footprints extending laterally in parallel. In some embodiments, the process for performing the fourth etch comprises forming a second photoresist layer 1106 on the third dielectric layer 228, and patterning the second photoresist layer 1106 to laterally surround regions of the third dielectric layer 228 and the ILD region 116 of the sensor chip 102 corresponding to the first pad opening(s) 1102, 1104. Thereafter, one or more second etchants 1108 are sequentially applied to the third dielectric layer 228 and the ILD region 116 of the sensor chip 102, while using the second photoresist layer 1106 as a mask, to form the first pad opening(s) 1102, 1104. With the first pad opening(s) 1102, 1104 formed, the second photoresist layer 1106 is removed.

Figure 12:
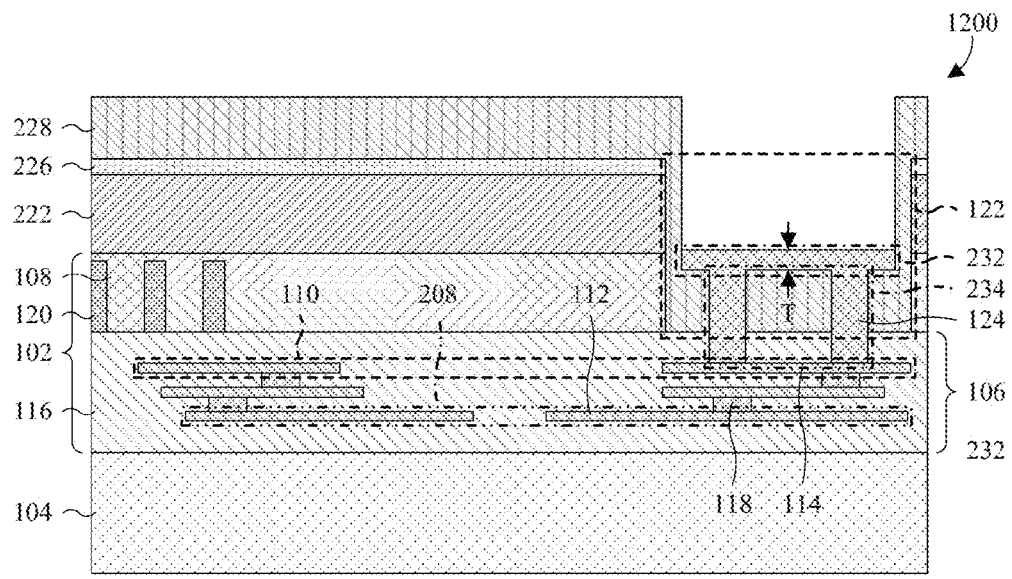

As illustrated by the cross-sectional view 1200 of FIG. 12, a pad structure 124 is formed filling the first pad opening(s) 1102, 1104 (see, e.g., FIG. 11) in the peripheral opening 122.

The pad structure 124 is formed with a base region 232 that has a substantially uniform thickness T and that is confined to the peripheral opening 122, over the third dielectric layer 228. Further, the pad structure 124 is formed with a protruding region 234 filling the first pad opening(s) 1102, 1104 and extending to an interconnect layer 110 of the sensor chip 102 from the base region 232. In some embodiments, the pad structure 124 is formed of copper or aluminum copper. Further, in some embodiments, the process of forming the pad structure 124 comprises covering the third dielectric layer 228, and filling the peripheral and first pad openings 122, 1102, 1104, with a second conductive layer. A planarization is then performed into the second conductive layer to planarize an upper or top surface of the second conductive layer, and an etch back is performed to etch back the upper or top surface of the second conductive layer to a location recessed below an upper or top surface of first dielectric layer 222. The planarization may be performed by, for example, a CMP.

Figure 13:
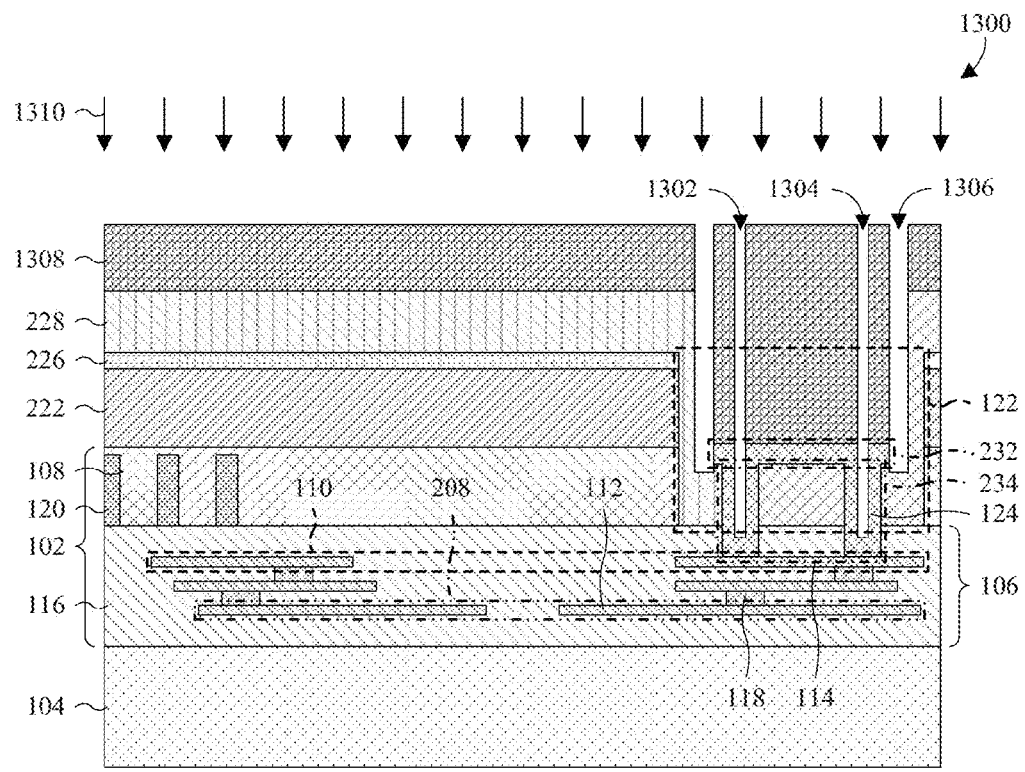

As illustrated by the cross-sectional view 1300 of FIG. 13, a fifth etch is performed into the pad structure 124 and, in some embodiments, the third dielectric layer 228. The fifth etch is performed to form one or more second pad openings 1302, 1304 extending through the base region 232, into the protruding region 234. The second pad opening(s) 1302, 1304 are laterally spaced and, in some embodiments, have line-shaped footprints extending laterally in parallel. Further, the fifth etch is performed to forming on or more spacing openings 1306 laterally spacing sidewall surfaces of the base region 232 from sidewall surfaces of the third dielectric layer 228. In some embodiments, the spacing opening(s) 1306 have line-shaped footprints, and/or extend into the third dielectric layer 228 due to over etching.

In some embodiments, the process for performing the fifth etch comprises forming a third photoresist layer 1308 on the third dielectric layer 228, and patterning the third photoresist layer 1308 to laterally surround regions of the third dielectric layer 228 and the pad structure 124 corresponding to the second pad opening(s) 1302, 1304 and the spacing opening(s) 1306. Thereafter, one or more third etchants 1310 are sequentially applied to the pad structure 124, while using the third photoresist layer 1308 as a mask, to form the second pad opening(s) 1302, 1304 and the spacing opening(s) 1306. With the second pad opening(s) 1302, 1304 and the spacing opening(s) 1306 formed, the third photoresist layer 1308 is removed.

Figure 14:
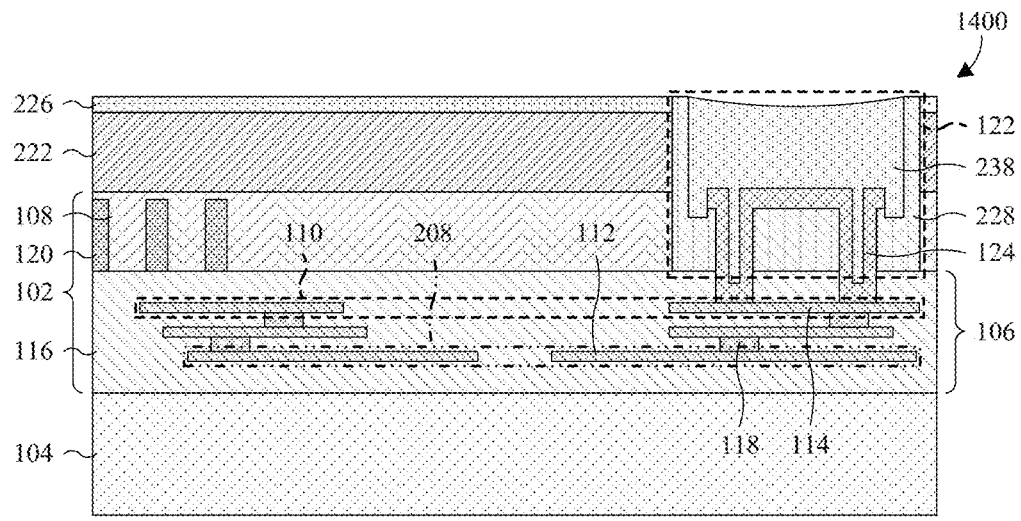

As illustrated by the cross-sectional view 1400 of FIG. 14, a fourth dielectric layer 238 is formed covering the pad structure 124, and filling the second pad opening(s) 1302, 1304 (see, e.g., FIG. 13), the spacing opening(s) 1306 (see, e.g., FIG. 13), and the peripheral opening 122, with an upper or top surface about even with an upper or top surface of the second dielectric layer 226. In some embodiments, the fourth dielectric layer 238 is formed of silicon dioxide, and/or is formed confined to the peripheral opening 122. Further, in some embodiments, the process for forming the fourth dielectric layer 238 comprises growing or otherwise depositing the fourth dielectric layer 238. The growing or depositing may be performed by, for example, CVD, PVD, ALD, thermal oxidation, or some other growth or deposition process. Thereafter, a planarization is performed into the fourth dielectric layer 238 and, in some embodiments, the third dielectric layer 228. Further, an etch back is performed into the fourth dielectric layer 238 and the third dielectric layer 228 to remove regions of the fourth dielectric layer 238 and the third dielectric layer 228 outside the peripheral opening 122.

Figure 15:
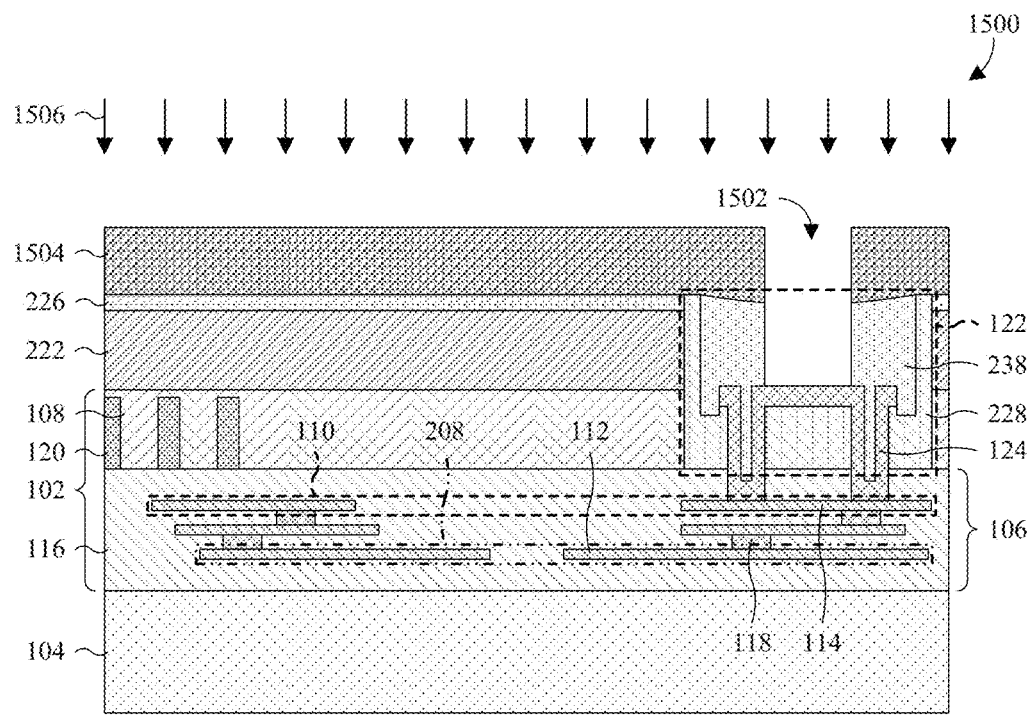

As illustrated by the cross-sectional view 1500 of FIG. 15, a sixth etch is performed into the fourth dielectric layer 238 to form a plug opening 1502 exposing the pad structure 124. In some embodiments, the process for performing the sixth etch comprises forming a fourth photoresist layer 1504 on the second and fourth dielectric layers 226, 238, and patterning the fourth photoresist layer 1504 to laterally surround regions of the fourth dielectric layer 238 corresponding to the plug opening 1502. Thereafter, one or more fourth etchants 1506 are sequentially applied to the fourth dielectric layer 238, while using the fourth photoresist layer 1504 as a mask, to form the plug opening 1502. With the plug opening 1502 formed, the fourth photoresist layer 1504 is removed.

Figure 16:
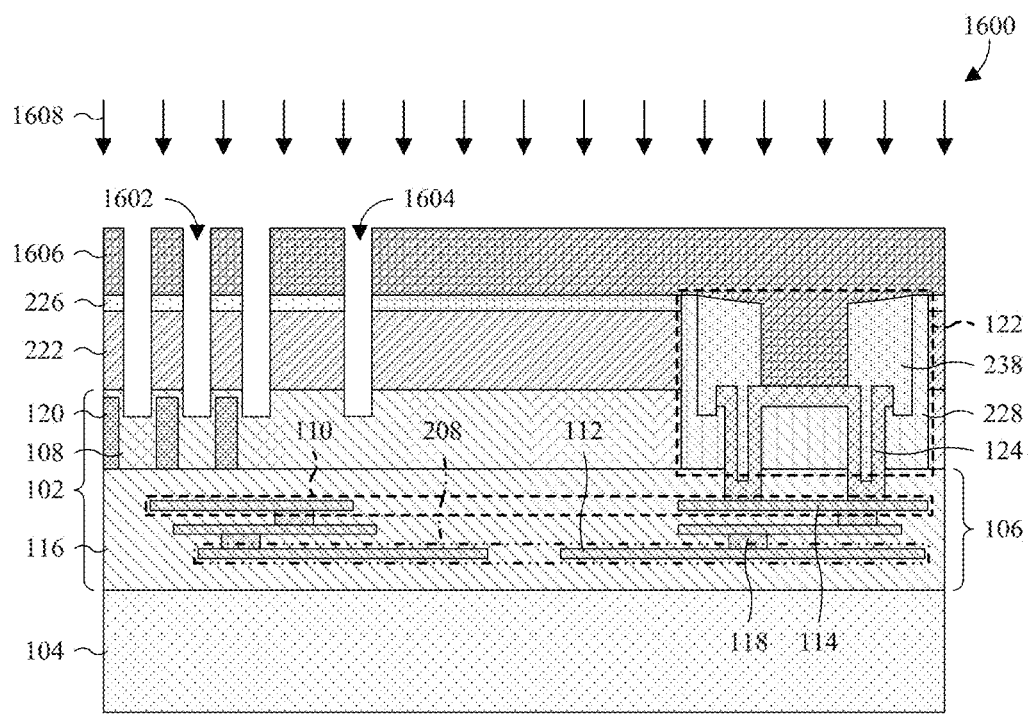

As illustrated by the cross-sectional view 1600 of FIG. 16, in some embodiments, a seventh etch is performed through the first and second dielectric layers 222, 226, into the second semiconductor substrate 108, to form a BDTI opening 1602 and a ground opening 1604. The BDTI opening 1602 is formed laterally between the photodetectors 120 according to a grid pattern, and the ground opening 1604 is formed laterally between the array of photodetectors 120 and the pad structure 124. In some embodiments, the ground opening 1604 is also formed laterally between the array of photodetectors 120 and the TIV 224 (see, e.g., FIG. 7).

In some embodiments, the process for performing the seventh etch comprises forming a fifth photoresist layer 1606 on the second and fourth dielectric layers 226, 238, and patterning the fifth photoresist layer 1606 to laterally surround regions of the second dielectric layer 226 corresponding to the BDTI opening 1602 and/or the ground opening 1604. Thereafter, one or more fifth etchants 1608 are sequentially applied to the first and second dielectric layers 222, 226 and the second semiconductor substrate 108, while using the fifth photoresist layer 1606 as a mask, to form the BDTI opening 1602 and/or the ground opening 1604. With the BDTI opening 1602 and/or the ground opening 1604 formed, the fifth photoresist layer 1606 is removed.

Figure 17:
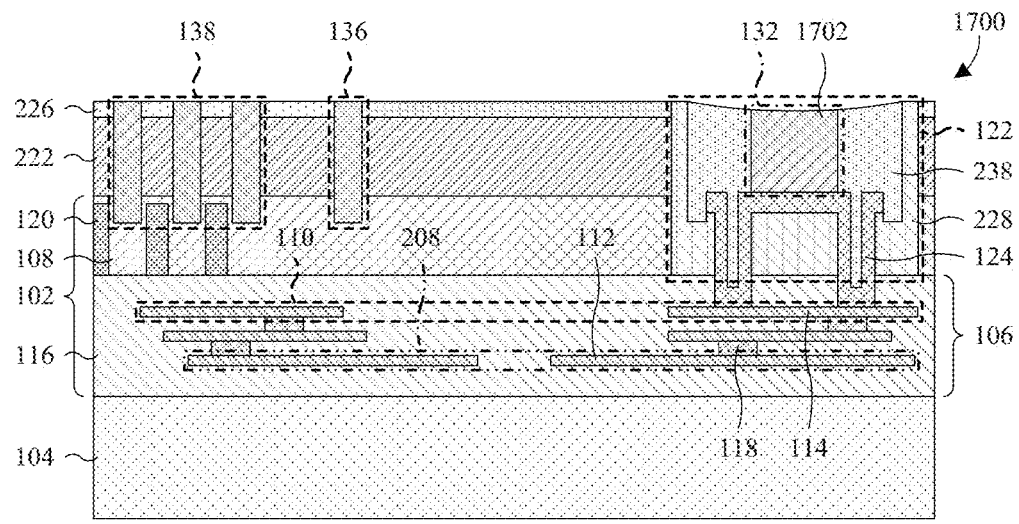

As illustrated by the cross-sectional view 1700 of FIG. 17, a third conductive layer 1702 is formed filling the plug opening 1502 (see, e.g., FIG. 15) and, in some embodiments, the BDTI opening 1602 (see, e.g., FIG. 16) and/or the ground opening 1604 (see, e.g., FIG. 16) with an upper or top surface about even with an upper or top surface of the second dielectric layer 226. The third conductive layer 1702 comprises a plug structure 132 electrically coupled to and overlying the pad structure 124. Further, in some embodiments, the third conductive layer 1702 comprises a BDTI structure 138 and/or a ground structure 136 extending into the second semiconductor substrate 108. The BDTI structure 138 is arranged laterally between the photodetectors 120 according to a grid pattern, and the ground structure 136 is arranged laterally between the array of photodetectors 120 and the pad structure 124. The third conductive layer 1702 may be formed of, for example, tungsten, copper, or some other conductive material.

In some embodiments, the process for forming the third conductive layer 1702 comprises growing or otherwise depositing the third conductive layer 1702. The growing or depositing may be performed by, for example, CVD, PVD, ALD, or some other growth or deposition process. Thereafter, a planarization is performed into the third conductive layer 1702. Further, an etch back is performed into the third conductive layer 1702 to remove regions of the third conductive layer 1702 outside the plug opening 1502 and, in some embodiments, outside the BDTI opening 1602 and/or the ground opening 1604. In some embodiments, the process for forming the third conductive layer 1702 further comprises forming a high κ dielectric layer and/or a diffusion barrier layer lining the plug opening 1502, the BDTI opening 1602, the ground opening 1604, or a combination of the foregoing before growing or otherwise depositing the third conductive layer 1702. The diffusion barrier layer may be formed of, for example, titanium nitride, and/or may be formed, for example, over the high κ dielectric layer.

Figure 18:
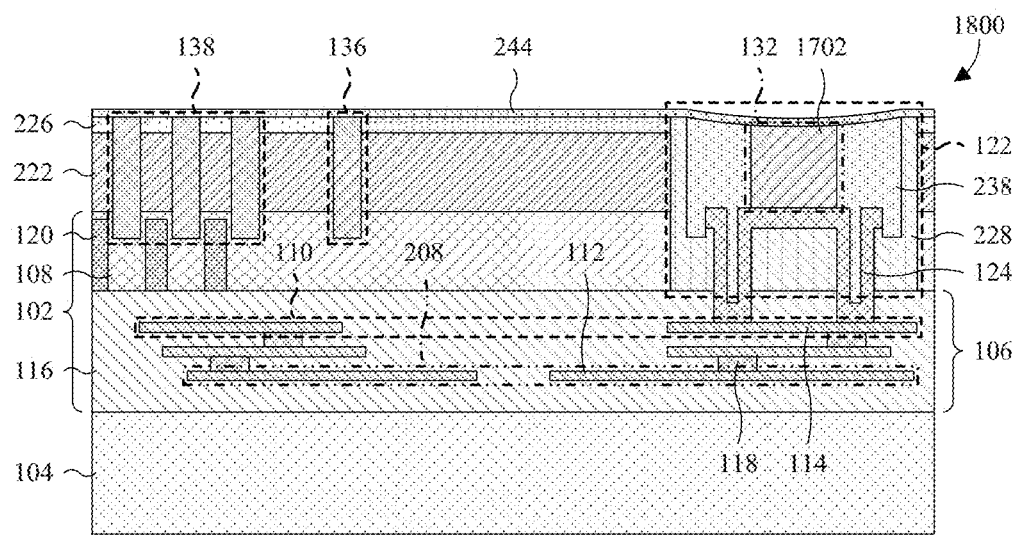

As illustrated by the cross-sectional view 1800 of FIG. 18, in some embodiments, a seventh dielectric layer 244 is formed covering the second, third, and fourth dielectric layers 226, 228, 238, as well as the third conductive layer 1702. In some embodiments, the seventh dielectric layer 244 is formed of silicon nitride or silicon dioxide. Further, in some embodiments, the process for forming the seventh dielectric layer 244 comprises growing or otherwise depositing the seventh dielectric layer 244. The growing or depositing may be performed by, for example, CVD, PVD, ALD, thermal oxidation, or some other growth or deposition process.

Figure 19:
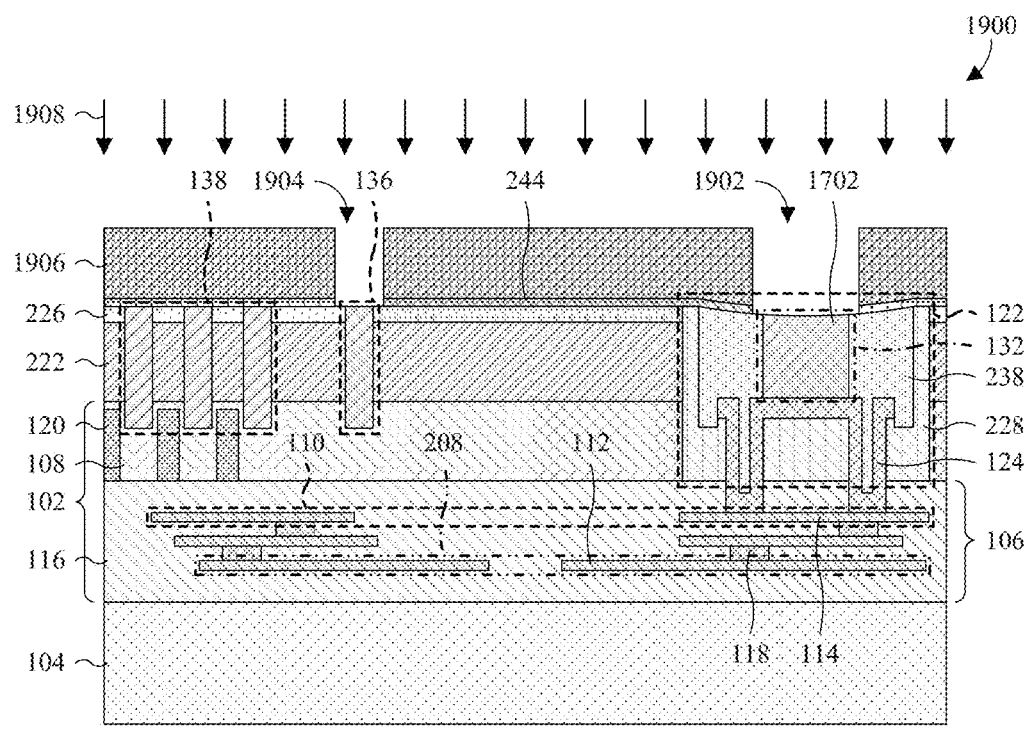

As illustrated by the cross-sectional view 1900 of FIG. 19, in some embodiments, an eighth etch is performed into the seventh dielectric layer 244 to form one or more contact openings 1902, 1904 exposing the plug structure 132 and/or the ground structure 136. In some embodiments, the process for performing the eighth etch comprises forming a sixth photoresist layer 1906 on the seventh dielectric layer 244, and patterning the sixth photoresist layer 1906 to laterally surround regions of the seventh dielectric layer 244 corresponding to the contact openings 1902, 1904. Thereafter, one or more sixth etchants 1908 are sequentially applied to the seventh dielectric layer 244, while using the sixth photoresist layer 1906 as a mask, to form the contact openings 1902, 1904. With the contact openings 1902, 1904 formed, the sixth photoresist layer 1906 is removed.

Figure 20:
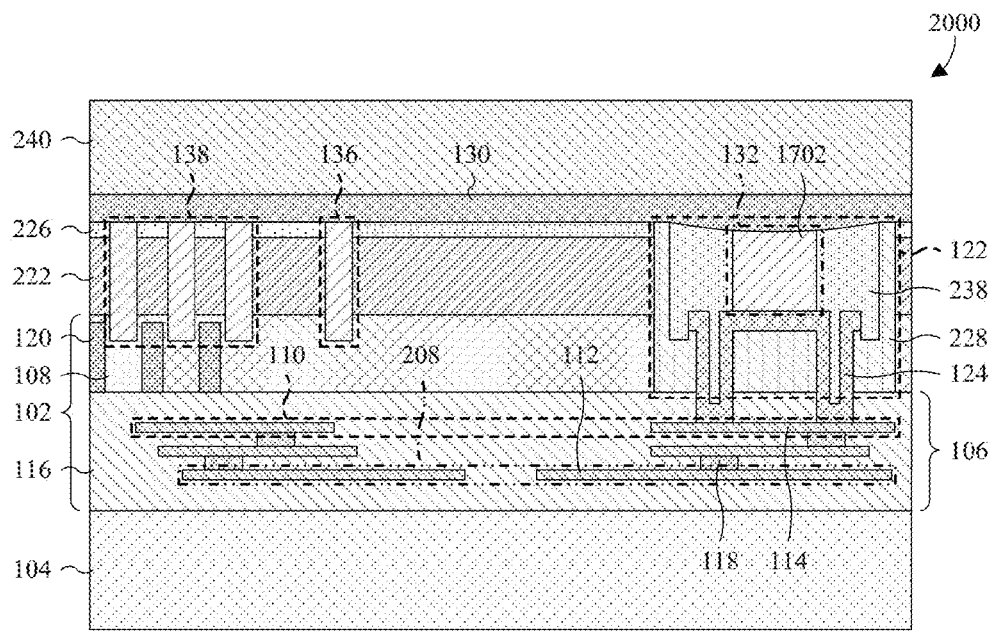

As illustrated by the cross-sectional view 2000 of FIG. 20, a fourth conductive layer 130 is formed covering the second, third, and fourth dielectric layers 226, 228, 238, as well as the third conductive layer 1702. Further, in some embodiments, the fourth conductive layer 130 is formed covering the seventh dielectric layer 244 (see, e.g., FIG. 19) and filling the contact opening(s) 1902, 1904 (see, e.g., FIG. 19). The fourth conductive layer 130 may be formed of, for example, tungsten, copper, or some other conductive material.

In some embodiments, the process for forming the fourth conductive layer 130 comprises growing or otherwise depositing the fourth conductive layer 130. The growing or depositing may be performed by, for example, CVD, PVD, ALD, or some other growth or deposition process. Further, in some embodiments, the process for forming the fourth conductive layer 130 comprises forming a diffusion barrier layer before growing or otherwise depositing the fourth conductive layer 130. The diffusion barrier layer is formed lining the second, third, and fourth dielectric layers 226, 228, 238, the third conductive layer 1702, and, in some embodiments, the seventh dielectric layer 244. The diffusion barrier layer may be formed of, for example, titanium nitride or tantalum nitride.

Also illustrated by the cross-sectional view 2000 of FIG. 20, a fifth dielectric layer 240 is formed covering the fourth conductive layer 130. In some embodiments, the fifth dielectric layer 240 is formed of silicon nitride, silicon dioxide, silicon oxynitride, some other dielectric, or a combination of the foregoing. For example, the fifth dielectric layer 240 may comprise an oxide layer and a silicon oxynitride layer overlying the oxide layer. In some embodiments, the process for forming the fifth dielectric layer 240 comprises sequentially growing or otherwise depositing the one or more layers defining the fifth dielectric layer 240. The growing or depositing may be performed by, for example, CVD, PVD, ALD, thermal oxidation, or some other growth or deposition process.

Figure 21:
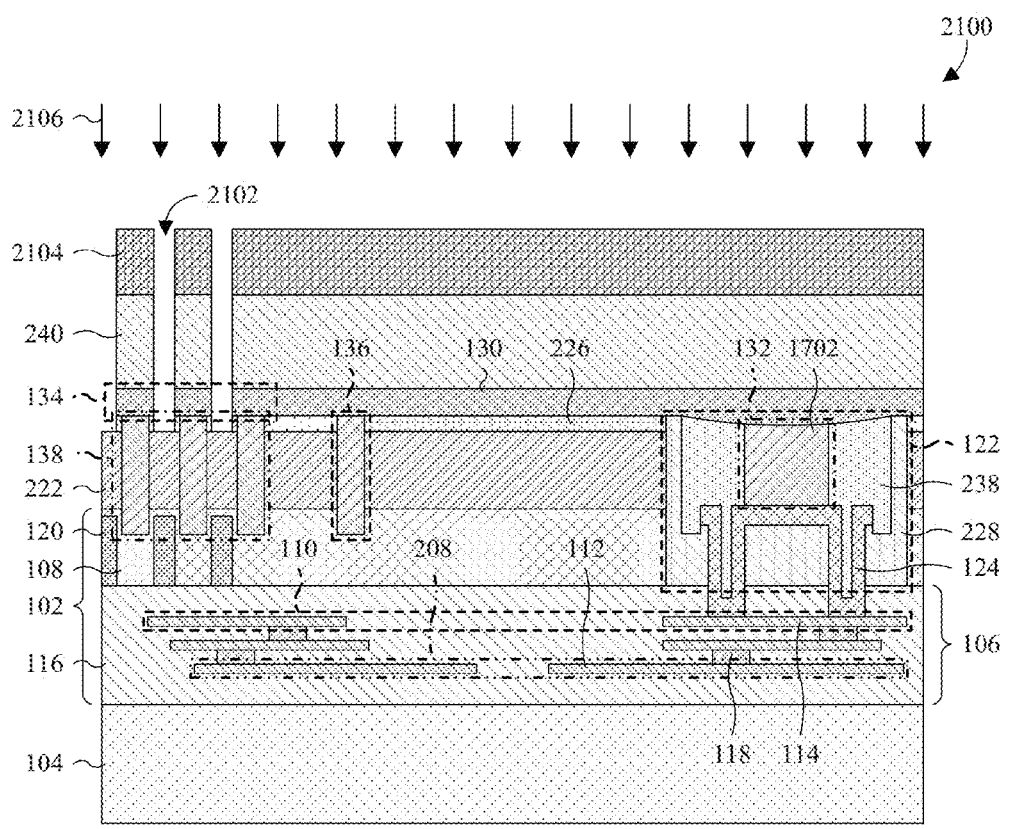

As illustrated by the cross-sectional view 2100 of FIG. 21, a ninth etch is performed through the fifth dielectric layer 240, the fourth conductive layer 130, and the second dielectric layer 226. The ninth etch is performed to form grid segment openings 2102 exposing the first dielectric layer 222, and to further form a backside shield structure 134 arranged laterally between the grid segment openings 2102 according to a grid pattern. For ease of illustration, only one of the grid segment openings 2102 is labeled. In some embodiments, the process for performing the ninth etch comprises forming a seventh photoresist layer 2104 on the fifth dielectric layer 240, and patterning the seventh photoresist layer 2104 to laterally surround regions of the fifth dielectric layer 240 corresponding to the grid segment openings 2102. Thereafter, one or more seventh etchants 2106 are sequentially applied to the fifth dielectric layer 240, the fourth conductive layer 130, and the second dielectric layer 226, while using the seventh photoresist layer 2104 as a mask, to form the grid segment openings 2102. With the grid segment openings 2102 formed, the seventh photoresist layer 2104 is removed.

Figure 22:
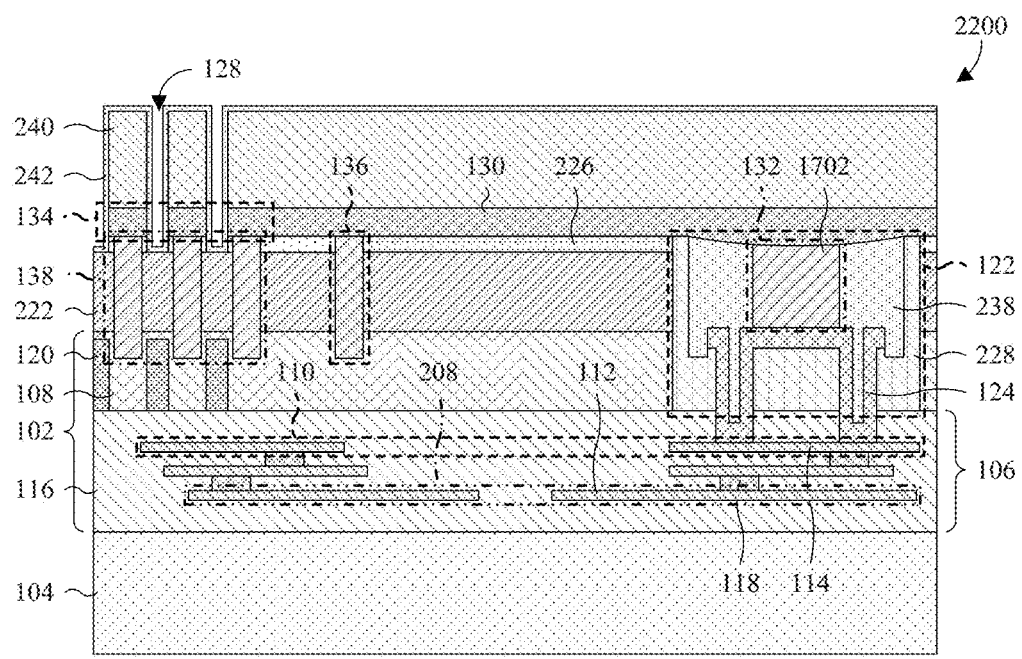

As illustrated by the cross-sectional view 2200 of FIG. 22, a sixth dielectric layer 242 is formed covering the fifth dielectric layer 240 and lining the grid segment openings 2102 (see, e.g., FIG. 21) to form color filter openings 128 in the grid segment openings 2102. For ease of illustration, only one of the color filter openings 128 is labeled. In some embodiments, the sixth dielectric layer 242 is formed of silicon nitride or silicon dioxide. Further, in some embodiments, the process for forming the sixth dielectric layer 242 comprises sequentially growing or otherwise depositing the sixth dielectric layer 242. The growing or depositing may be performed by, for example, CVD, PVD, ALD, thermal oxidation, or some other growth or deposition process.

Figure 23:
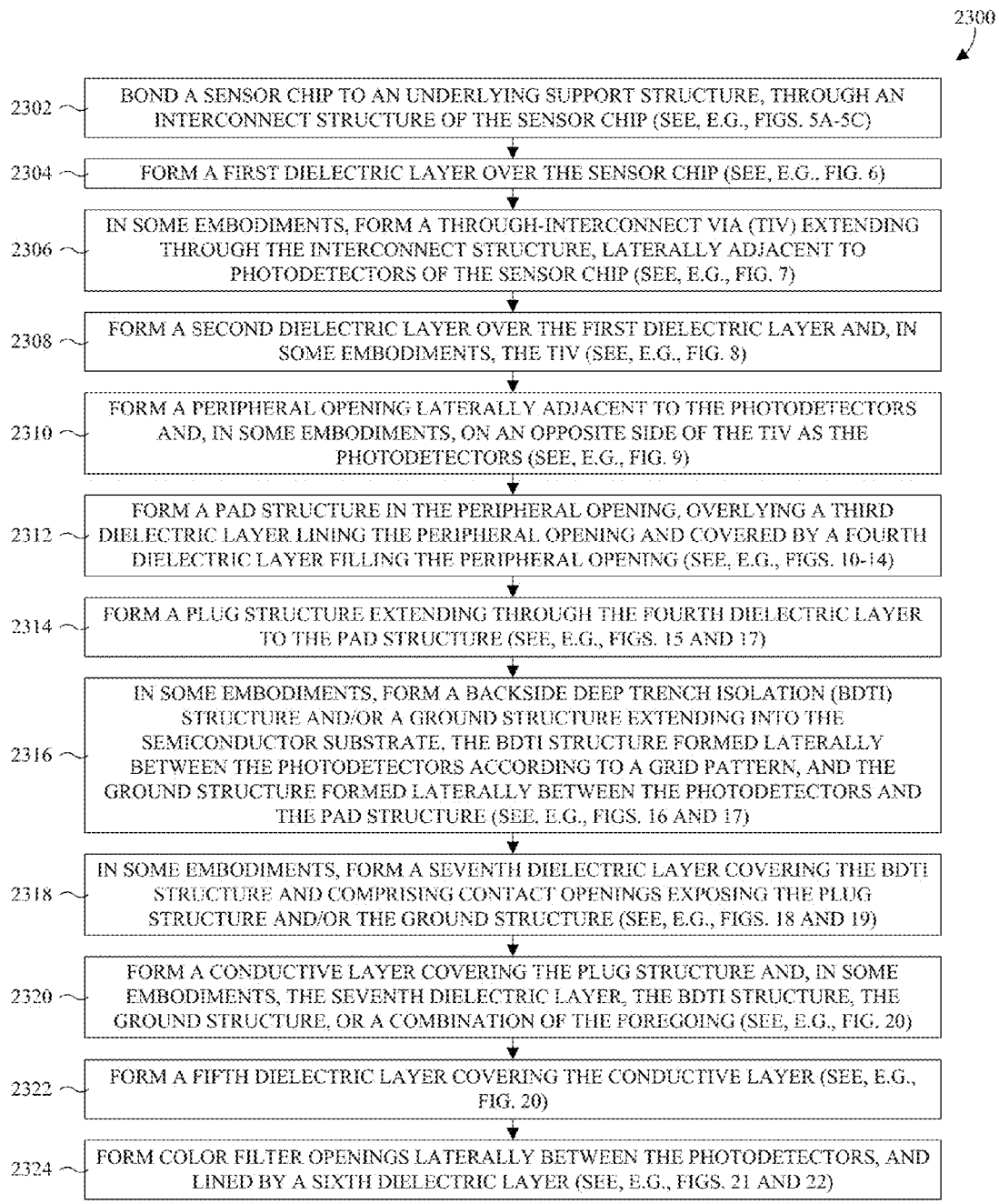
FIG. 23 illustrates a flowchart of some embodiments of a method for manufacturing a BSI image sensor for biased BDTI and/or biased backside shielding.

With reference to FIG. 23, a flowchart 2300 of some embodiments of a method for manufacturing a BSI image sensor for biased BDTI and/or biased backside shielding is provided.

At 2302, a sensor chip is bonded to an underlying support structure, through an interconnect structure of the sensor chip. See, for example, FIGS. 5A-5C.

At 2304, a first dielectric layer is formed over the sensor chip. See, for example, FIG. 6.

At 2306, in some embodiments, a TIV is formed extending through the interconnect structure, laterally adjacent to photodetectors of the sensor chip. See, for example, FIG. 7.

At 2308, a second dielectric layer is formed over the first dielectric layer and, in some embodiments, the TIV. See, for example, FIG. 8.

At 2310, a peripheral opening is formed laterally adjacent to the photodetectors and, in some embodiments, on an opposite side of the TIV as the photodetectors. See, for example, FIG. 9.

At 2312, a pad structure is formed in the peripheral opening, overlying a third dielectric layer lining the peripheral opening and covered by a fourth dielectric layer filling the peripheral opening. See, for example, FIGS. 10-14.

At 2314, a plug structure is formed extending through the fourth dielectric layer to the pad structure. See, for example, FIGS. 15 and 17.

At 2316, in some embodiments, a BDTI structure and/or a ground structure are formed extending into the semiconductor substrate. See, for example, FIGS. 16 and 17. The BDTI structure is formed laterally between the photodetectors according to a grid pattern, and the ground structure is formed laterally between the photodetectors and the pad structure.

At 2318, in some embodiments, a seventh dielectric layer is formed covering the BDTI structure and comprising contact openings exposing the plug structure and/or the ground structure. See, for example, FIGS. 18 and 19.

At 2320, a conductive layer is formed covering the plug structure and, in some embodiments, the seventh dielectric layer, the BDTI structure, the ground structure, or a combination of the foregoing. See, for example, FIG. 20.

At 2322, a fifth dielectric layer is formed covering the conductive layer. See, for example, FIG. 20.

At 2324, color filter openings are formed laterally between the photodetectors, and lined by a sixth dielectric layer. See, for example, FIGS. 21 and 22.

While the method described by the flowchart 2300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides an image sensor for biased BDTI and/or biased backside shielding. A photodetector is arranged in a semiconductor substrate, laterally adjacent to a peripheral opening in the semiconductor substrate. A interconnect structure is arranged under the semiconductor substrate. A pad structure is arranged in the peripheral opening, and protrudes through a lower surface of the peripheral opening to the interconnect structure. A conductive layer is electrically coupled to the pad structure, and extends laterally towards the photodetector from over the pad structure.

In other embodiments, the present disclosure provides a method for manufacturing an image sensor for biased BDTI and/or biased backside shielding. A dielectric layer is formed covering a semiconductor substrate. An etch is performed into the dielectric layer and the semiconductor substrate to form a peripheral opening in the semiconductor substrate, laterally adjacent to a photodetector in the semiconductor substrate. A pad structure is formed in the peripheral opening and protrudes through a lower surface of the peripheral opening to an interconnect structure underlying the semiconductor substrate. A conductive layer is formed electrically coupled to the pad structure and extending laterally towards the photodetector from over the pad structure.

In yet other embodiments, the present disclosure provides an image sensor for biased BDTI and/or biased backside shielding. An array of photodetectors is arranged in a semiconductor substrate, laterally adjacent to a peripheral opening in the semiconductor substrate. A pad structure is arranged in the peripheral opening, and protrudes through a lower surface of the peripheral opening to an underlying interconnect structure. A conductive layer is electrically coupled to the pad structure, and extends laterally towards the photodetector from over the pad structure. The conductive layer is arranged laterally between color filter openings according to a first grid pattern, and the color filter openings overlap respective ones of the photodetectors. A BDTI structure extends into the semiconductor substrate, and is arranged laterally between the photodetectors according to a second grid pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
    a photodetector arranged in a semiconductor substrate, laterally adjacent to a peripheral opening in the semiconductor substrate;
    an interconnect structure arranged under the semiconductor substrate;
    a pad structure arranged in the peripheral opening, and protruding through a lower surface of the peripheral opening to the interconnect structure; and
    a conductive layer electrically coupled to the pad structure, and extending laterally towards the photodetector from over the pad structure, wherein the conductive layer is spaced over and at least partially covers the pad structure.

2. The image sensor according to claim 1, further comprising:
    a backside deep trench isolation (BDTI) structure extending from the conductive layer into the semiconductor substrate, wherein the BDTI structure laterally surrounds the photodetector and is electrically coupled to the conductive layer.

3. The image sensor according to claim 2, wherein the conductive layer comprises a backside shield structure arranged over the BDTI structure, and wherein the backside shield structure laterally surrounds a color filter opening overlapping with the photodetector.

4. The image sensor according to claim 3, further comprising:
    a ground structure extending from the conductive layer into the semiconductor substrate, wherein the ground structure is arranged laterally between the BDTI structure and the pad structure.

5. The image sensor according to claim 1, further comprising:
    a ground structure extending from the conductive layer into the semiconductor substrate, wherein the ground structure is arranged laterally adjacent to the photodetector and is electrically coupled to the conductive layer.

6. The image sensor according to claim 5, wherein a sidewall surface of the conductive layer is arranged laterally between the photodetector and the ground structure.

7. The image sensor according to claim 1, further comprising:
    an array of photodetectors arranged in the semiconductor substrate and comprising the photodetector, wherein the conductive layer comprises a backside shield structure arranged laterally between color filter openings according to a first grid pattern, and wherein the color filter openings overlap respective ones of the photodetectors; and a backside deep trench isolation (BDTI) structure extending from the conductive layer into the semiconductor substrate, and arranged laterally between the photodetectors according to a second grid pattern.

8. The image sensor according to claim 1, further comprising:

a dielectric region filling the peripheral opening and covering the conductive layer; and a conductive plug extending from the conductive layer, through the dielectric region, to the pad structure.

9. The image sensor according to claim 1, further comprising:

a through-interconnect via (TIV) extending through the interconnect structure to a support structure underlying the interconnect structure, and electrically coupling the pad structure to the support structure.

10. The image sensor according to claim 1, further comprising:

a support structure arranged under and contacting the interconnect structure, wherein the support structure and the interconnect structure comprise respective bond pads arranged at an interface between the support structure and the interconnect structure, and wherein the bond pads abut to electrically couple the pad structure to the support structure.

11. An image sensor comprising:

a photodetector arranged in a semiconductor substrate, laterally adjacent to a peripheral opening in the semiconductor substrate;

an interconnect structure arranged under the semiconductor substrate;

a pad structure arranged in the peripheral opening, and protruding through a lower surface of the peripheral opening to the interconnect structure; and a conductive layer electrically coupled to the pad structure, and extending laterally towards the photodetector from over the pad structure, wherein the conductive layer comprises a backside shield structure laterally surrounding a color filter opening overlapping with the photodetector.

12. The image sensor according to claim 11, further comprising:

a ground structure extending from the conductive layer into the semiconductor substrate, wherein the ground structure is arranged laterally between the backside shield structure and the pad structure.

13. The image sensor according to claim 12, further comprising:

a backside deep trench isolation (BDTI) structure extending into the semiconductor substrate, wherein the BDTI structure laterally surrounds the photodetector and is electrically coupled to the conductive layer through the ground structure; and a dielectric region vertically insulating the BDTI structure from the conductive layer, wherein the conductive layer protrudes through the dielectric region to the ground structure.

14. The image sensor according to claim 11, wherein the interconnect structure comprises a plurality of first via layers and a plurality of first wiring layers alternatingly stacked with the first via layers, and wherein the image sensor further comprises:

a second semiconductor substrate;

a second interconnect structure covering the second semiconductor substrate, between the second semiconductor substrate and the interconnect structure, and wherein the second interconnect structure comprises a plurality of second via layers and a plurality of second wiring layers alternatingly stacked with the second via layers; and a through via extending from over the the pad structure, through the semiconductor substrate and the interconnect structure, to contact with a top one of the second wiring layers, wherein the through via laterally contacts a bottom one of the first wiring layers.

15. The image sensor according to claim 11, wherein the interconnect structure comprises a plurality of first via layers and a plurality of first wiring layers alternatingly stacked with the first via layers, and wherein the image sensor further comprises:

a second semiconductor substrate;

a second interconnect structure covering the second semiconductor substrate, between the second semiconductor substrate and the interconnect structure, and wherein the second interconnect structure comprises a plurality of second via layers and a plurality of second wiring layers alternatingly stacked with the second via layers; and a hybrid bond structure between the interconnect structure and the second interconnect structure, wherein the hybrid bond structure comprises a direct dielectric-to-dielectric bond between the interconnect structure and the second interconnect structure, wherein the hybrid bond further comprises a direct metal-to-metal bond between the interconnect structure and the second interconnect structure, and wherein the direct metal-to-metal bond electrically couples the interconnect structure to the second interconnect structure.

16. The image sensor according to claim 11, further comprising:

a conductive plug over and contacting the pad structure; and a conductive backside deep trench isolation (BDTI) structure extending into the semiconductor substrate, and arranged laterally between the photodetectors according to a grid pattern;

wherein the conductive layer is over and contacts the conductive plug, wherein the conductive layer extends laterally to the conductive BDTI structure from the pad structure and covers the conductive BDTI structure.

17. An image sensor comprising:

an array of photodetectors arranged in a semiconductor substrate, laterally adjacent to a peripheral opening in the semiconductor substrate;

a pad structure arranged in the peripheral opening, and protruding through a lower surface of the peripheral opening to an underlying interconnect structure;

a conductive layer electrically coupled to the pad structure, and extending laterally towards the array of photodetectors from over the pad structure, wherein the conductive layer is arranged laterally between color filter openings according to a first grid pattern, and wherein the color filter openings overlap respective ones of the photodetectors; and a backside deep trench isolation (BDTI) structure extending into the semiconductor substrate, and arranged laterally between the photodetectors according to a second grid pattern.

18. The image sensor according to claim 17, wherein the conductive layer covers and contacts the BDTI structure, and wherein the image sensor further comprises:
- a dielectric layer filling the peripheral opening and partially covering the pad structure; and
- a conductive plug extending from contact with the conductive layer, through the dielectric layer, to contact with the pad structure.

19. The image sensor according to claim 17, further comprising:
- a dielectric layer covering and contacting a top surface of the BDTI structure, wherein the conductive layer covers and contacts the dielectric layer, wherein the conductive layer protrudes through the dielectric layer to culminate at a bottom surface laterally spaced between the BDTI structure and the peripheral opening; and
- a ground structure extending into the semiconductor substrate from contact with the bottom surface of the conductive layer.

20. The image sensor according to claim 17, wherein the interconnect structure comprises a plurality of via layers and a plurality of conductive-line layers alternatingly stacked with the via layers, wherein the pad structure comprises a conductive base region spaced over the interconnect structure by a dielectric region, and wherein the pad structure further comprises a conductive protruding region protruding downward from the conductive base region, through the dielectric region, to contact with a topmost one of the conductive-line layers.

* * * * *